(12) United States Patent
Lim et al.

(10) Patent No.: US 11,694,964 B2
(45) Date of Patent: *Jul. 4, 2023

(54) FLEXIBLE CIRCUIT BOARD AND CHIP PACKAGE INCLUDING SAME

(71) Applicant: LG INNOTEK CO., LTD., Seoul (KR)

(72) Inventors: Jun Young Lim, Seoul (KR); Hyung Kyu Yoon, Seoul (KR); Sung Min Chae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/559,125

(22) Filed: Dec. 22, 2021

(65) Prior Publication Data

US 2022/0148976 A1    May 12, 2022

Related U.S. Application Data

(63) Continuation of application No. 16/756,552, filed as application No. PCT/KR2018/012687 on Oct. 25, 2018, now Pat. No. 11,239,172.

(30) Foreign Application Priority Data

Nov. 2, 2017  (KR) .................. 10-2017-0145443

(51) Int. Cl.
*H01L 23/48*    (2006.01)
*H01L 23/538*   (2006.01)
(Continued)

(52) U.S. Cl.
CPC .... *H01L 23/5387* (2013.01); *H01L 23/49866* (2013.01); *H01L 23/5386* (2013.01);
(Continued)

(58) Field of Classification Search
None
See application file for complete search history.

(56) References Cited

U.S. PATENT DOCUMENTS 6,542,374 B1    4/2003   Muramatsu et al.
9,332,649 B2    5/2016   Kim et al.
(Continued)

FOREIGN PATENT DOCUMENTS

CN      103809314 A     5/2014
JP      H05-299786      11/1993
(Continued)

OTHER PUBLICATIONS

U.S. Office Action dated Jun. 24, 2021 issued in U.S. Appl. No. 16/756,552.

*Primary Examiner* — Hung K Vu
(74) *Attorney, Agent, or Firm* — Ked & Associates, LLP

(57) ABSTRACT

A flexible circuit board according to an embodiment of the present invention comprises: a substrate; a first wiring pattern layer disposed on a first surface of the substrate; a second wiring pattern layer disposed on a second surface opposite the first surface of the substrate; a first dummy pattern part disposed on the second surface of the substrate on which the second wiring pattern layer is not disposed; a first protection layer disposed on the first wiring pattern layer; and a second protection layer disposed on the second wiring pattern layer and the first dummy pattern part, wherein at least a part of the first dummy pattern part overlaps with the first wiring pattern layer in a vertical direction.

19 Claims, 24 Drawing Sheets

(51) Int. Cl.
   *H01L 23/498* (2006.01)
   *H01L 23/00* (2006.01)
   *H01L 25/16* (2023.01)
   *H01L 25/18* (2023.01)

(52) U.S. Cl.
   CPC .............. *H01L 24/16* (2013.01); *H01L 25/16* (2013.01); *H01L 25/18* (2013.01); *H01L 2224/16227* (2013.01)

(56) References Cited

U.S. PATENT DOCUMENTS

| | | | |
|---|---|---|---|
| 11,239,172 B2* | 2/2022 | Lim | ................... H01L 23/5387 |
| 2009/0016030 A1 | 1/2009 | Takahashi | |
| 2014/0131889 A1* | 5/2014 | Kim | ................... H01L 23/4985 |
| | | | 174/254 |

FOREIGN PATENT DOCUMENTS

| | | |
|---|---|---|
| JP | 6888171 | 6/2021 |
| KR | 10-2000-0048249 | 7/2000 |
| KR | 10-2010-0040063 | 4/2010 |
| KR | 10-2013-0121382 A | 11/2013 |
| KR | 10-1369300 | 3/2014 |
| KR | 10-2014-0062607 | 5/2014 |
| KR | 10-1396433 | 5/2014 |

* cited by examiner

[FIG. 1A]
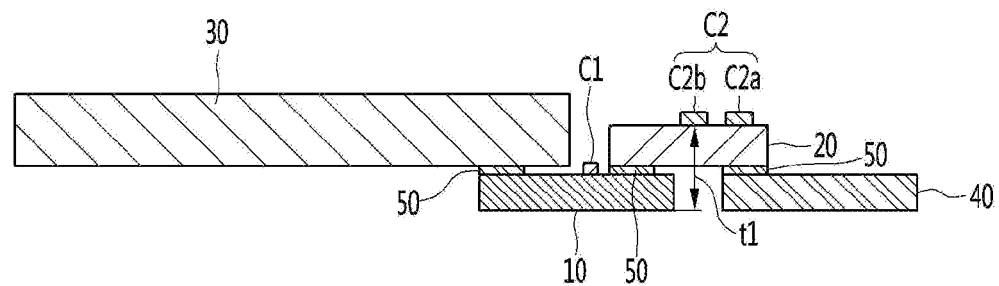
[FIG. 1B]
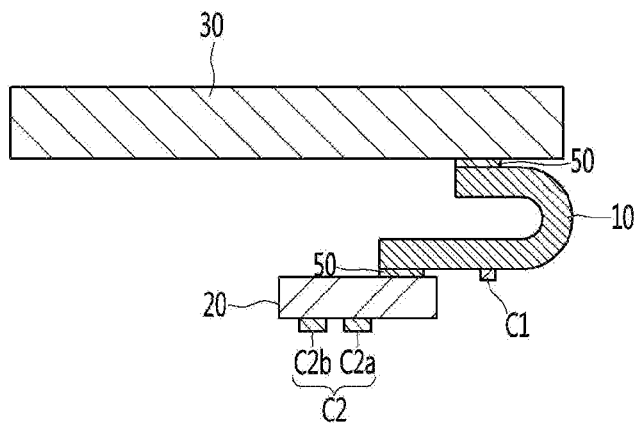
[FIG. 1C]
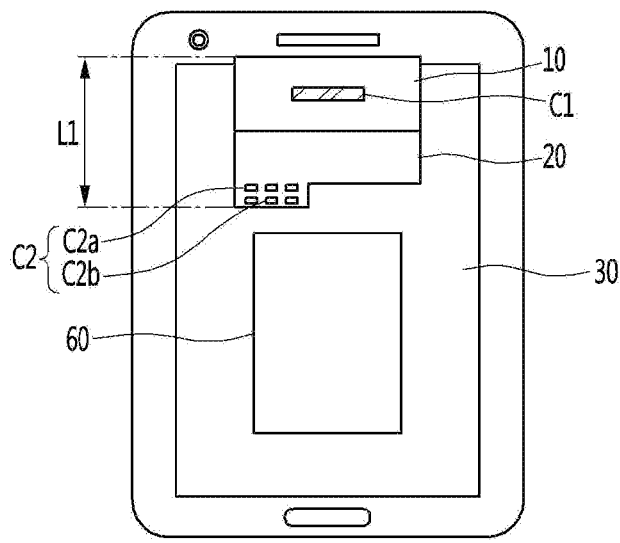

[FIG. 2A]
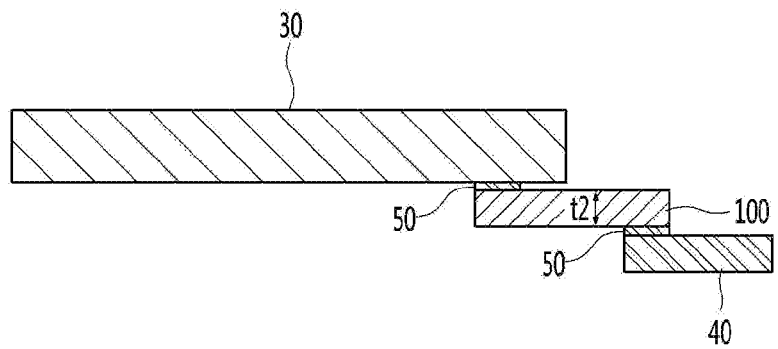
[FIG. 2B]
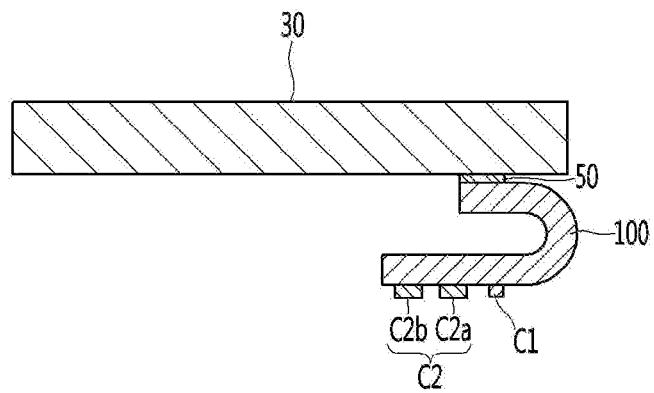
[FIG. 2C]
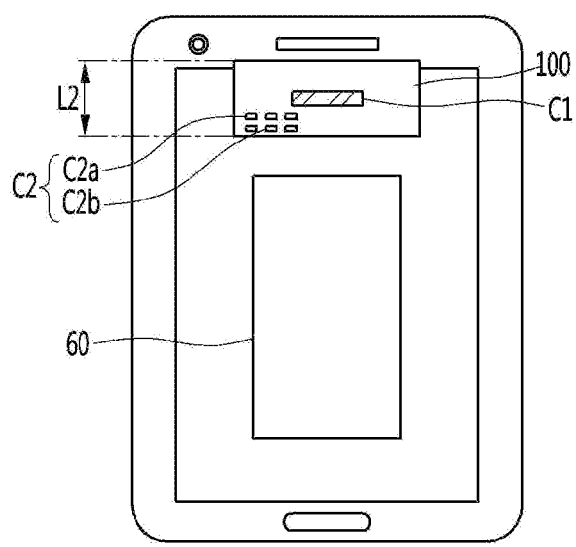

[FIG. 3A]
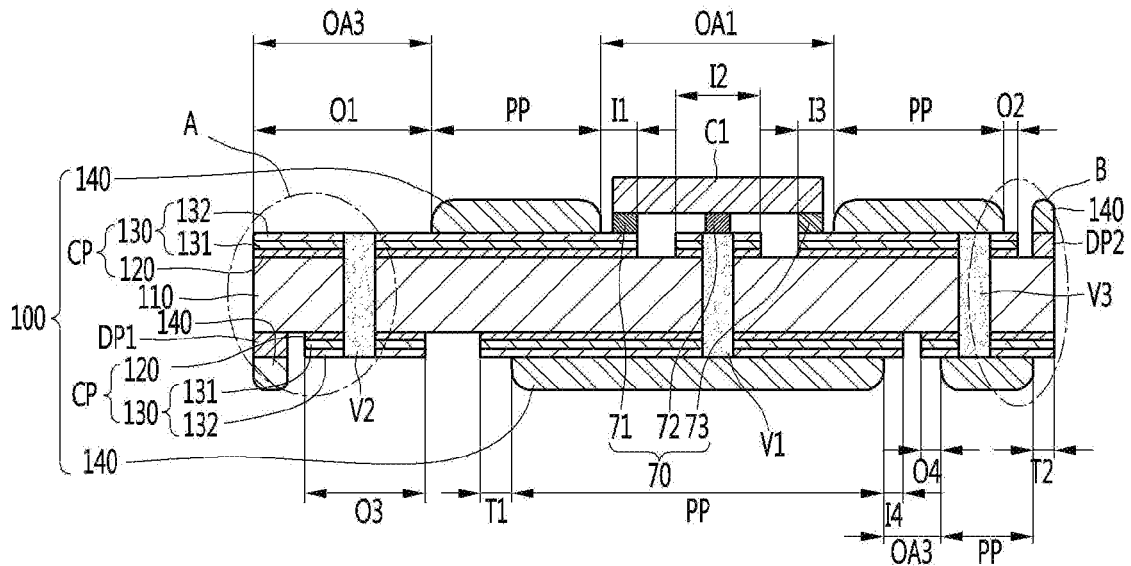
[FIG. 3B]
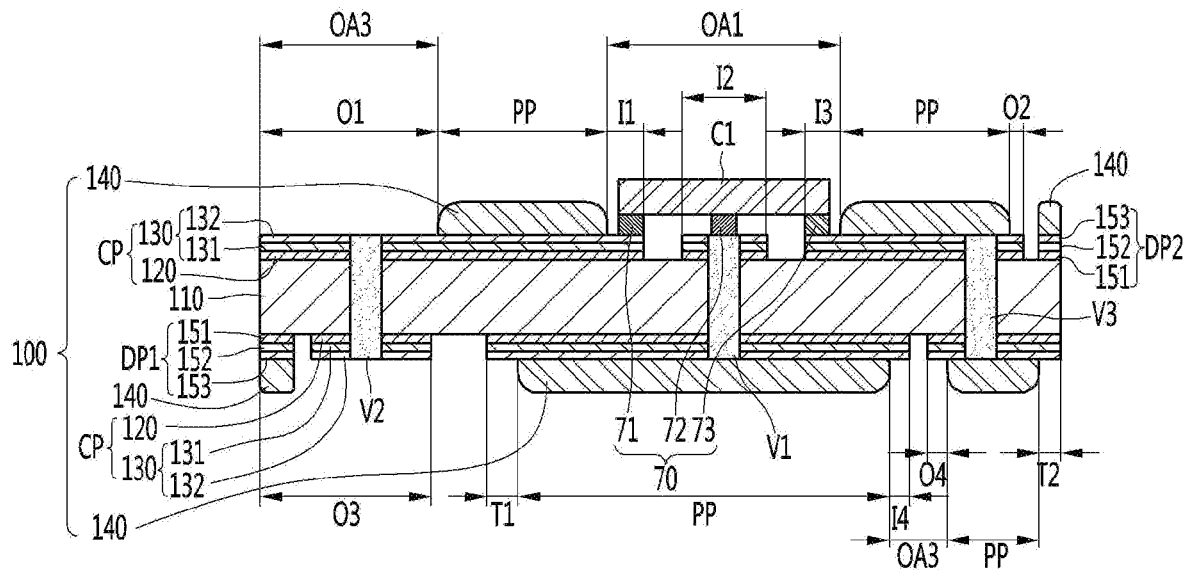

[FIG. 4A]
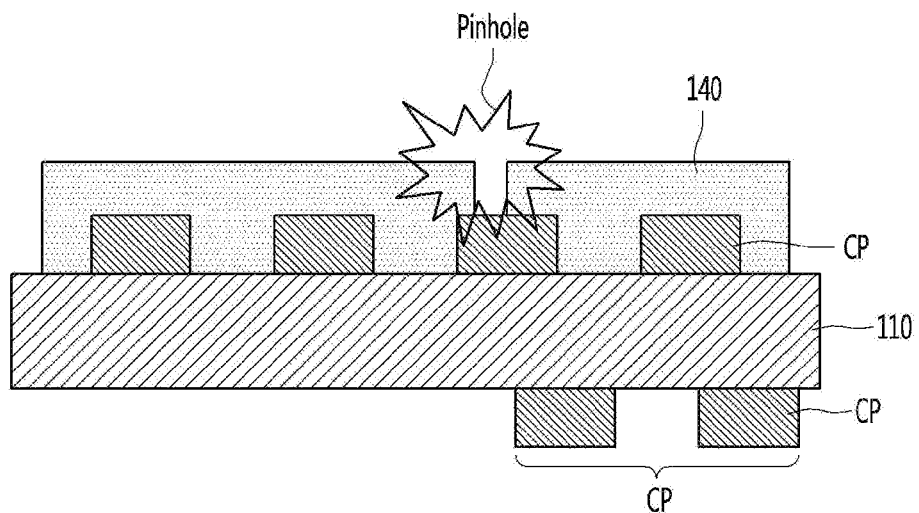
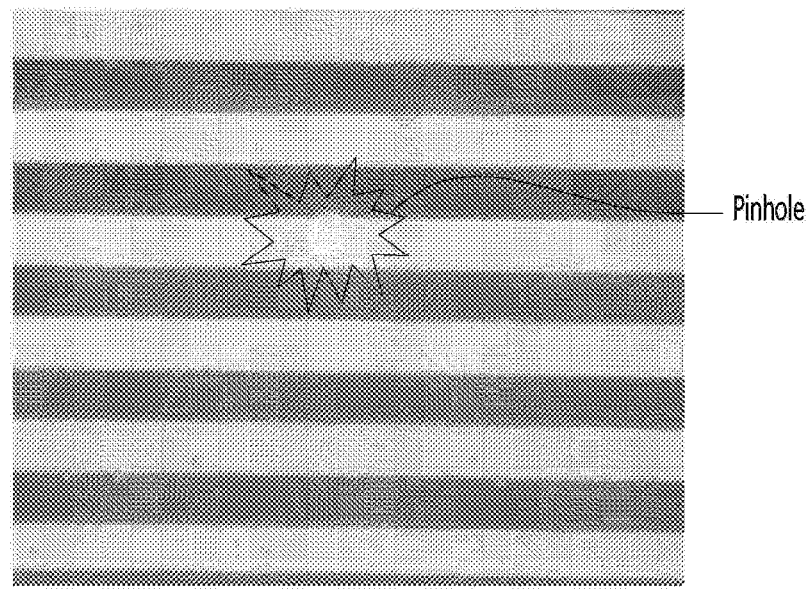

[FIG. 4B]
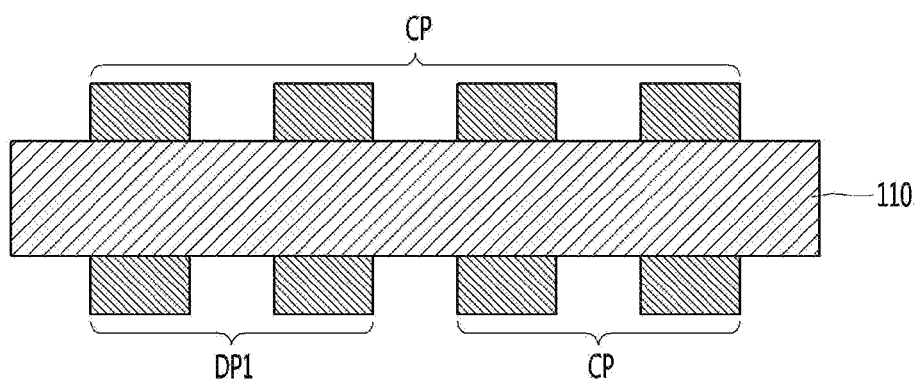
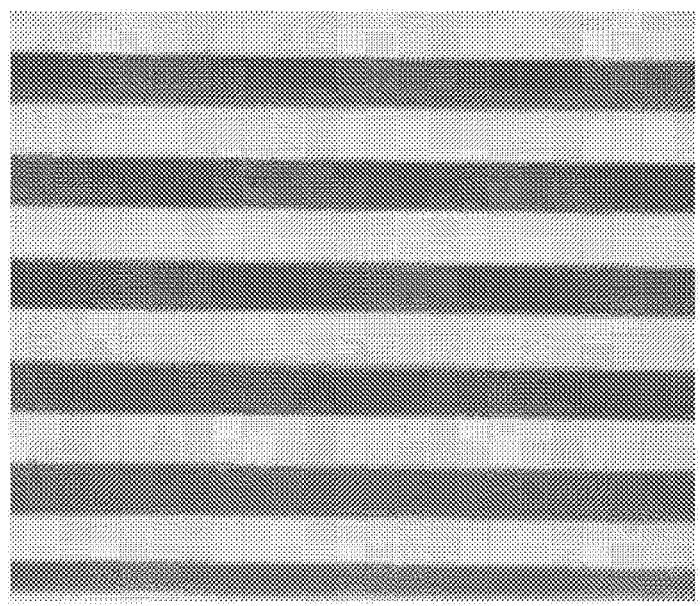

[FIG. 5A]
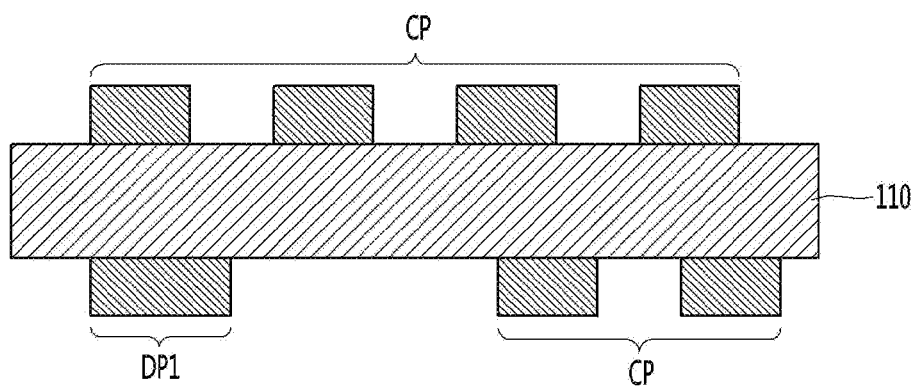
[FIG. 5B]
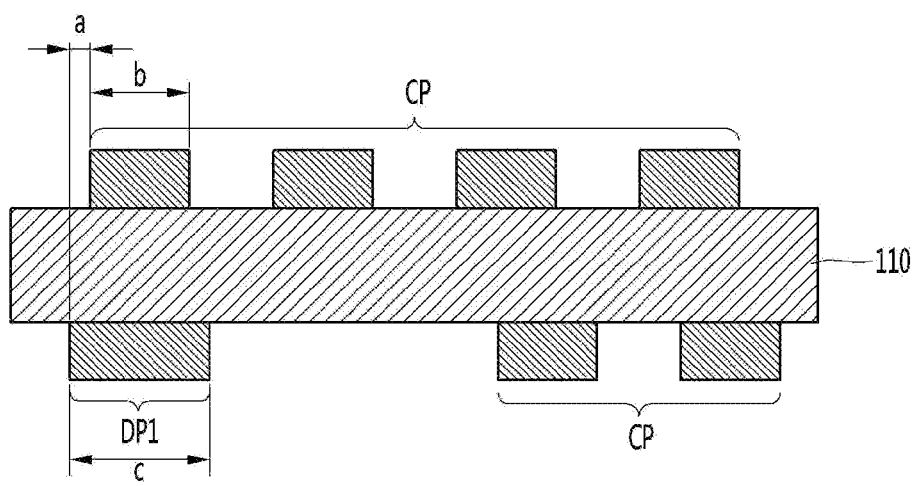

[FIG. 5C]
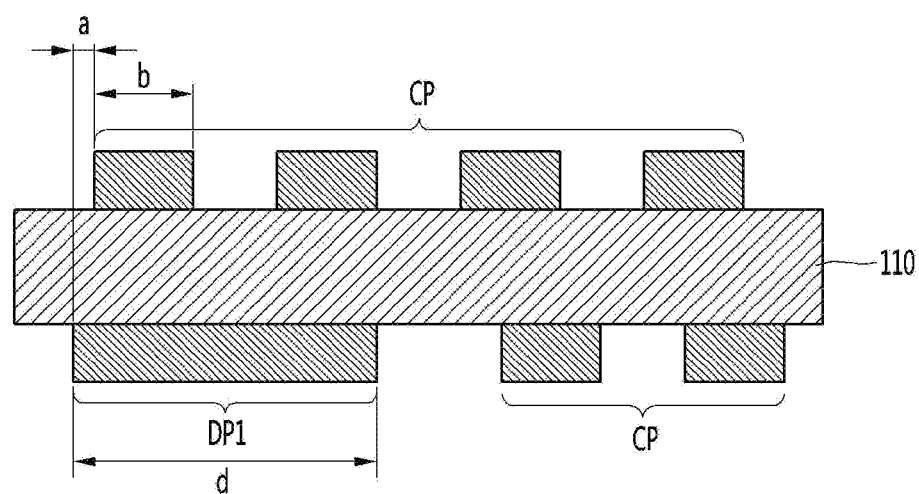

[FIG. 5D]
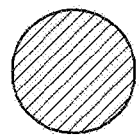
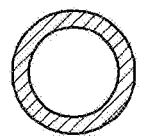
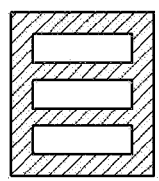
[FIG. 6]
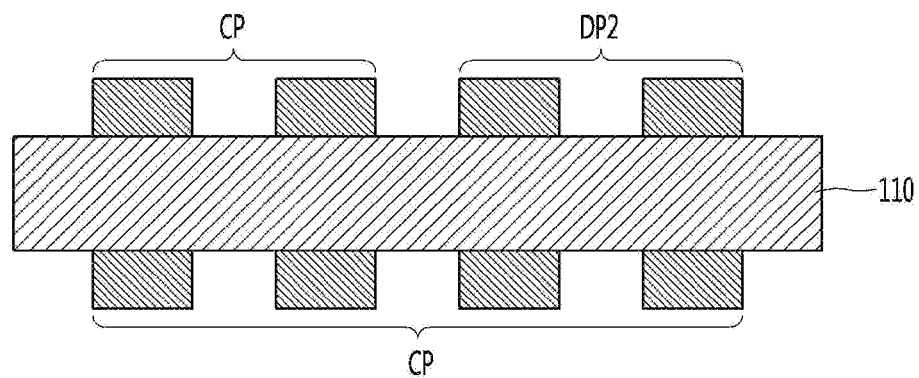

[FIG. 7A]
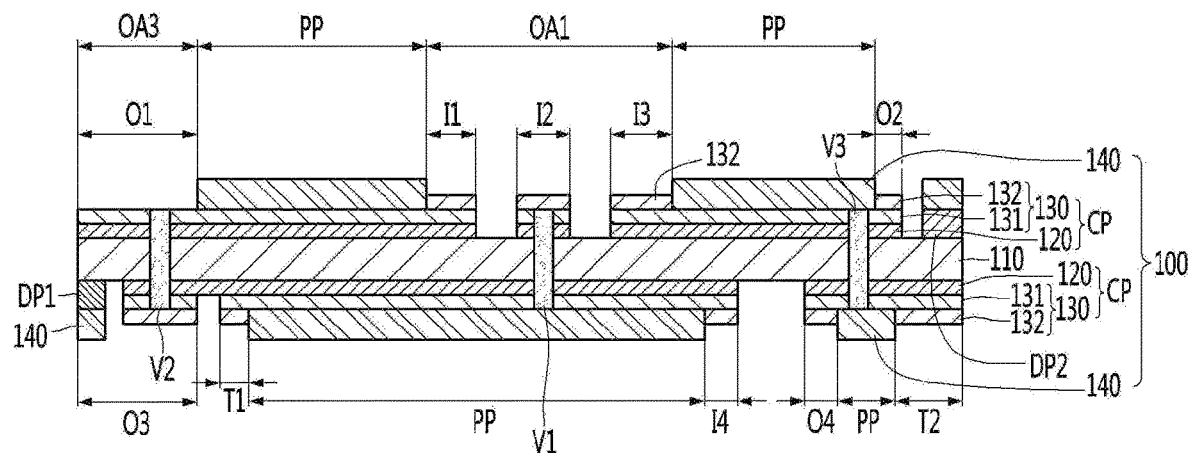
[FIG. 7B]
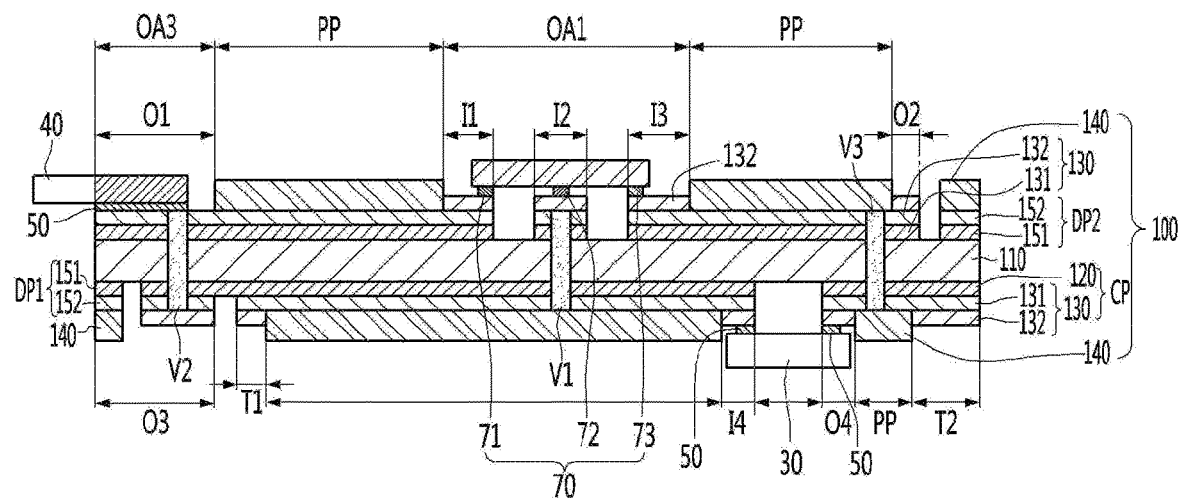

[FIG. 8]
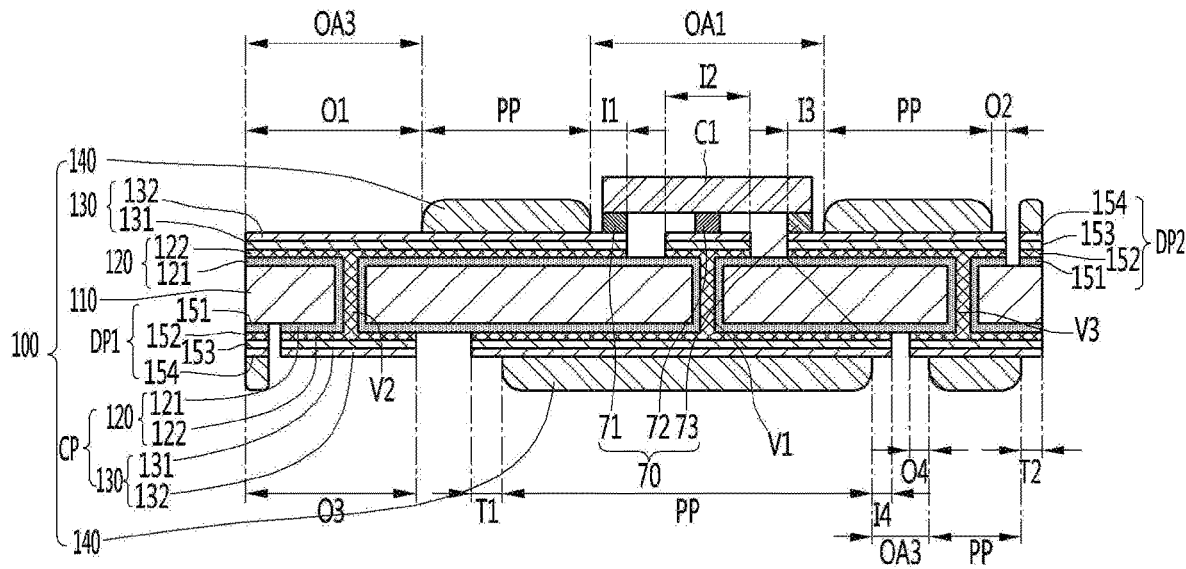
[FIG. 9]
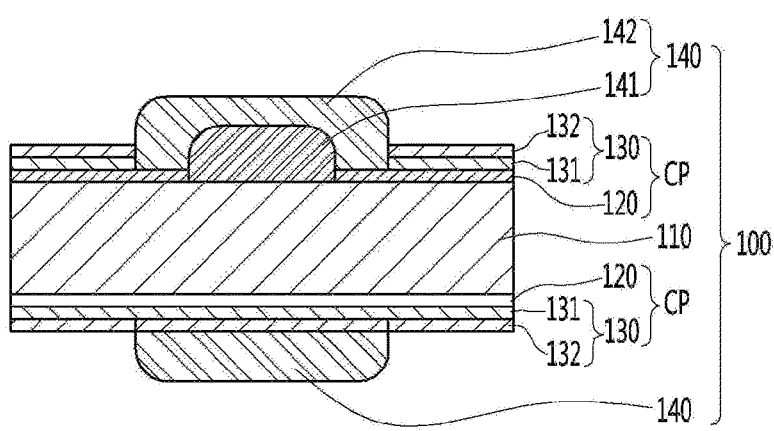

[FIG. 10]
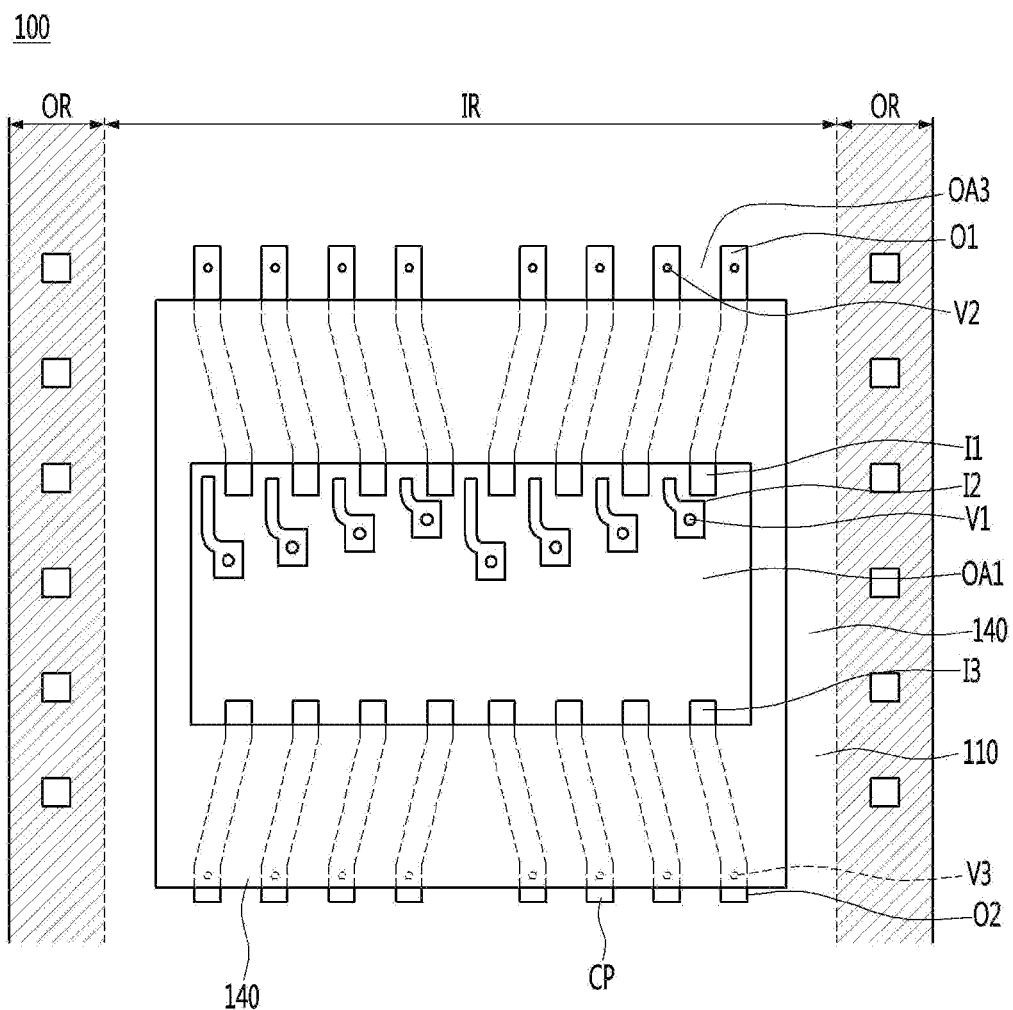

[FIG. 11]
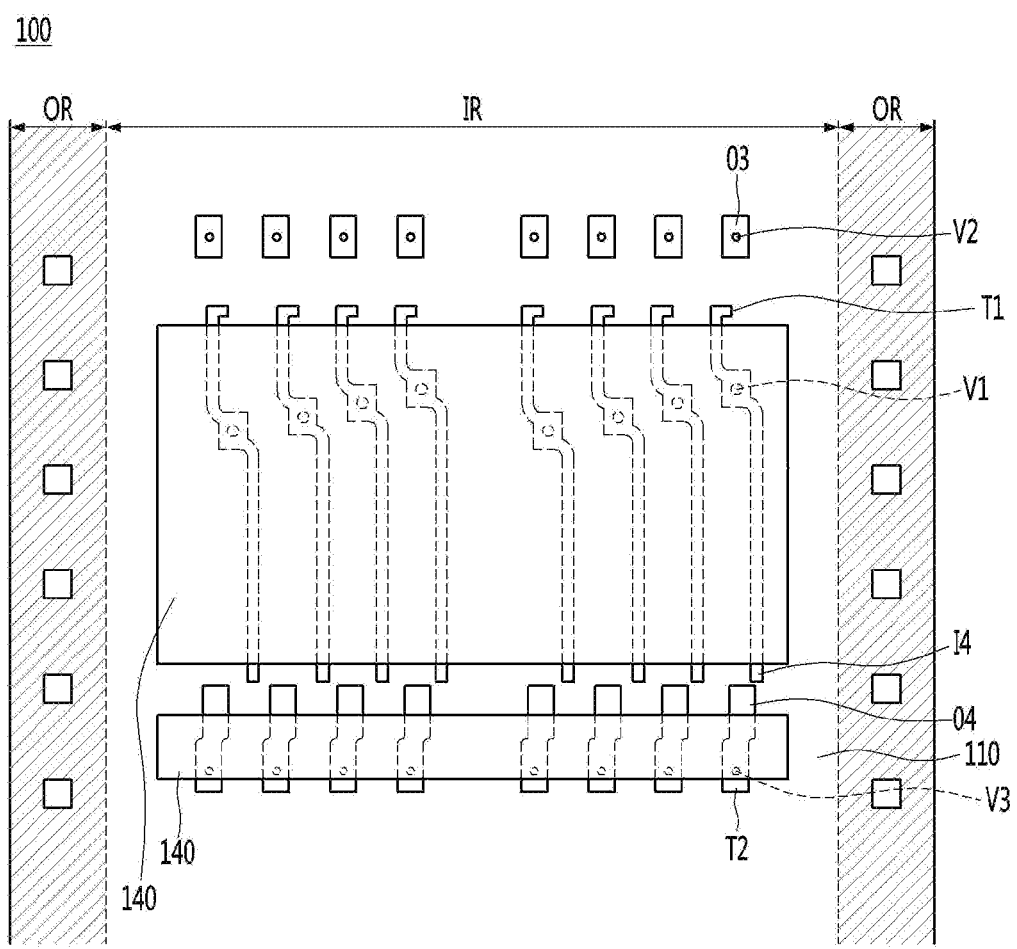

[FIG. 12A]
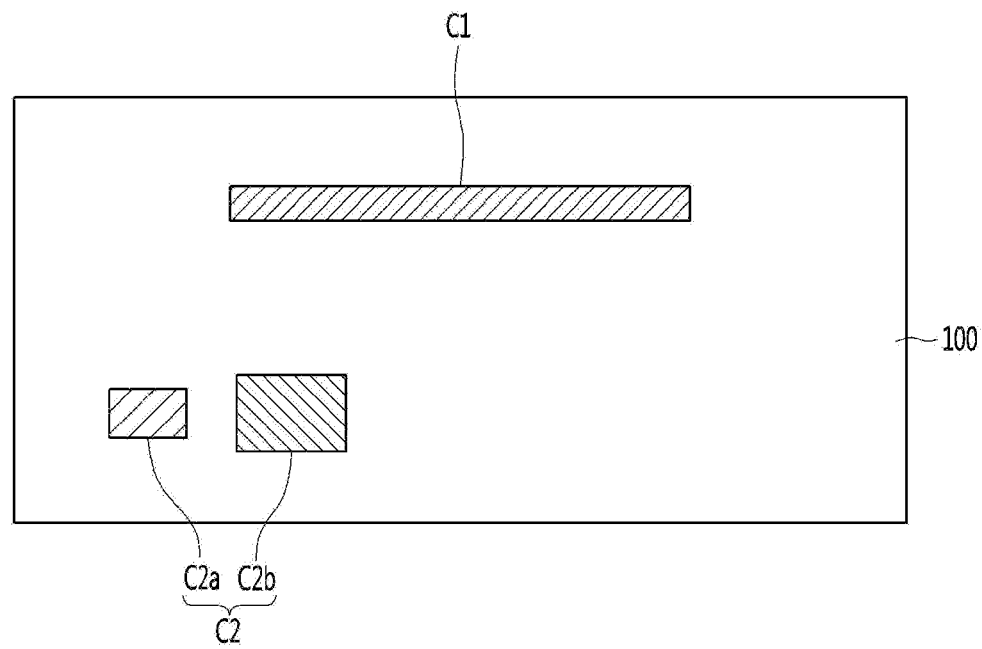
[FIG. 12B]
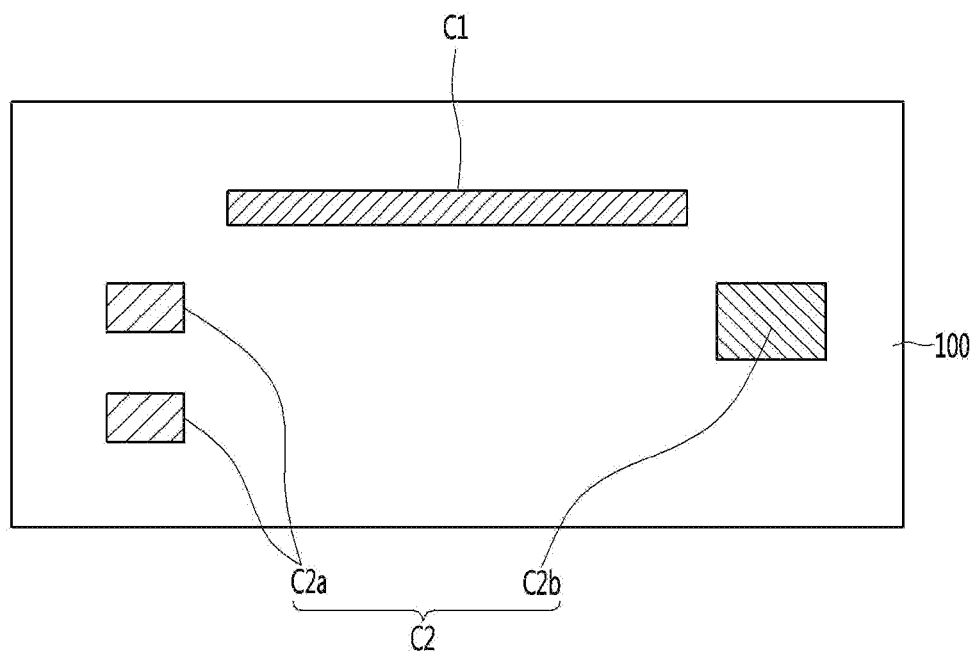

[FIG. 13A]
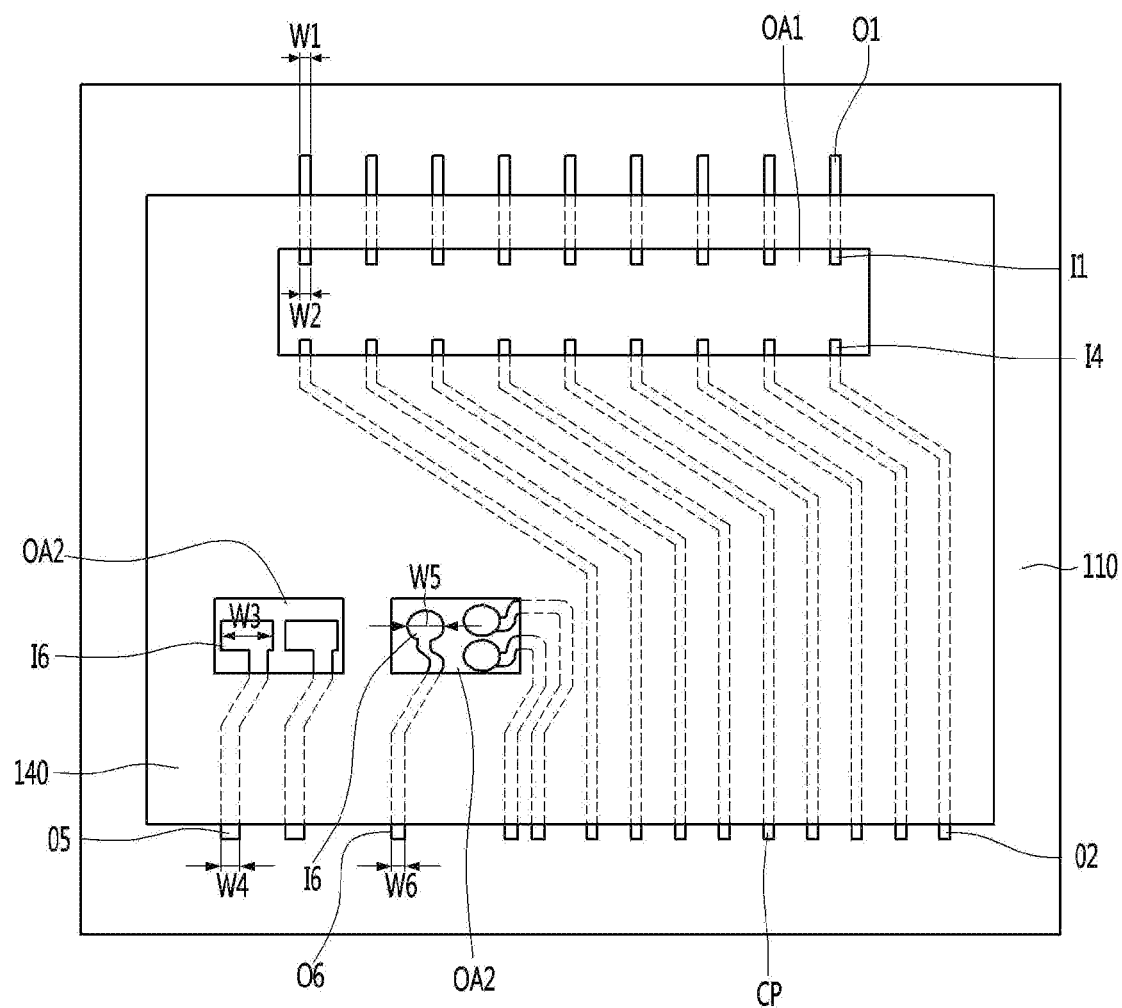

[FIG. 13B]
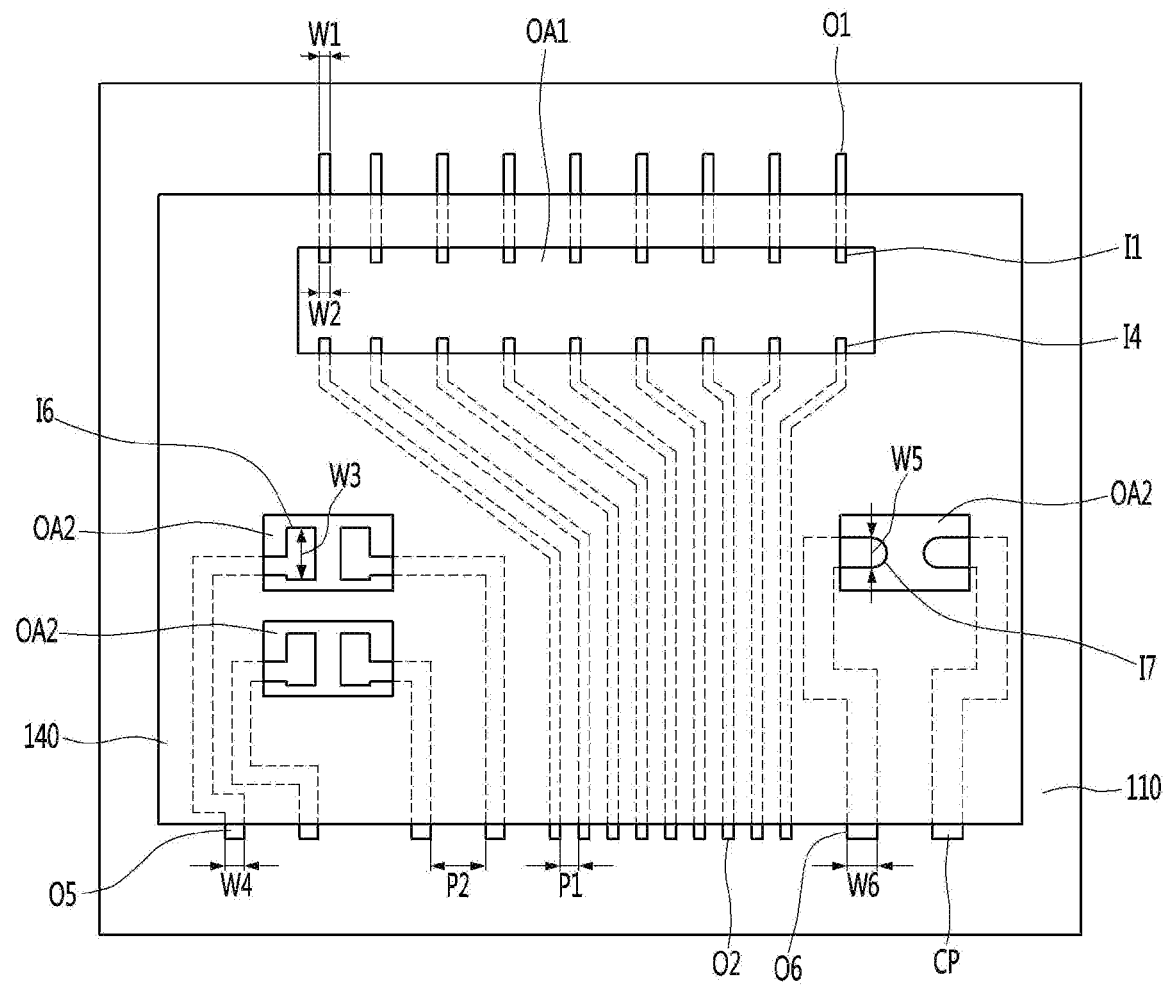

[FIG. 14A]
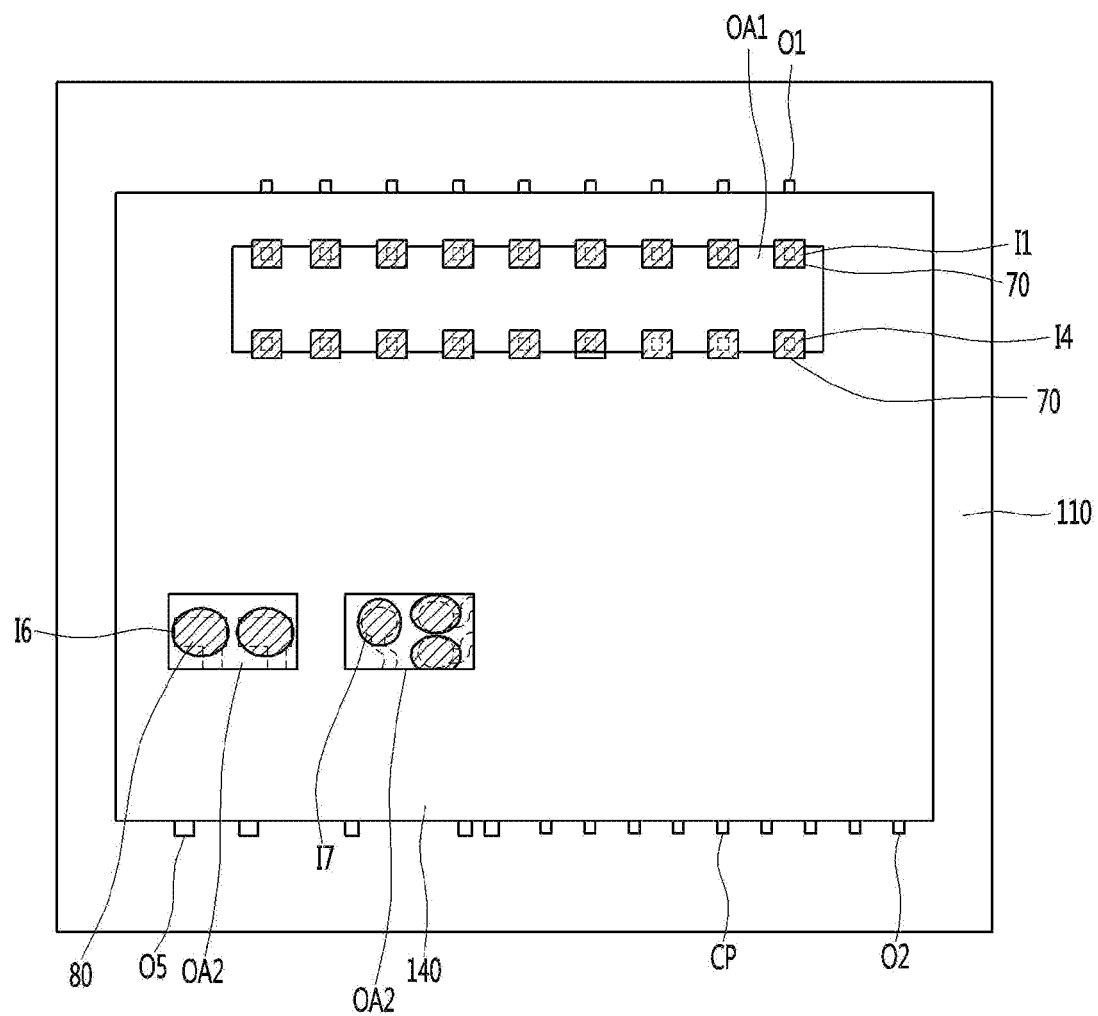

[FIG. 14B]
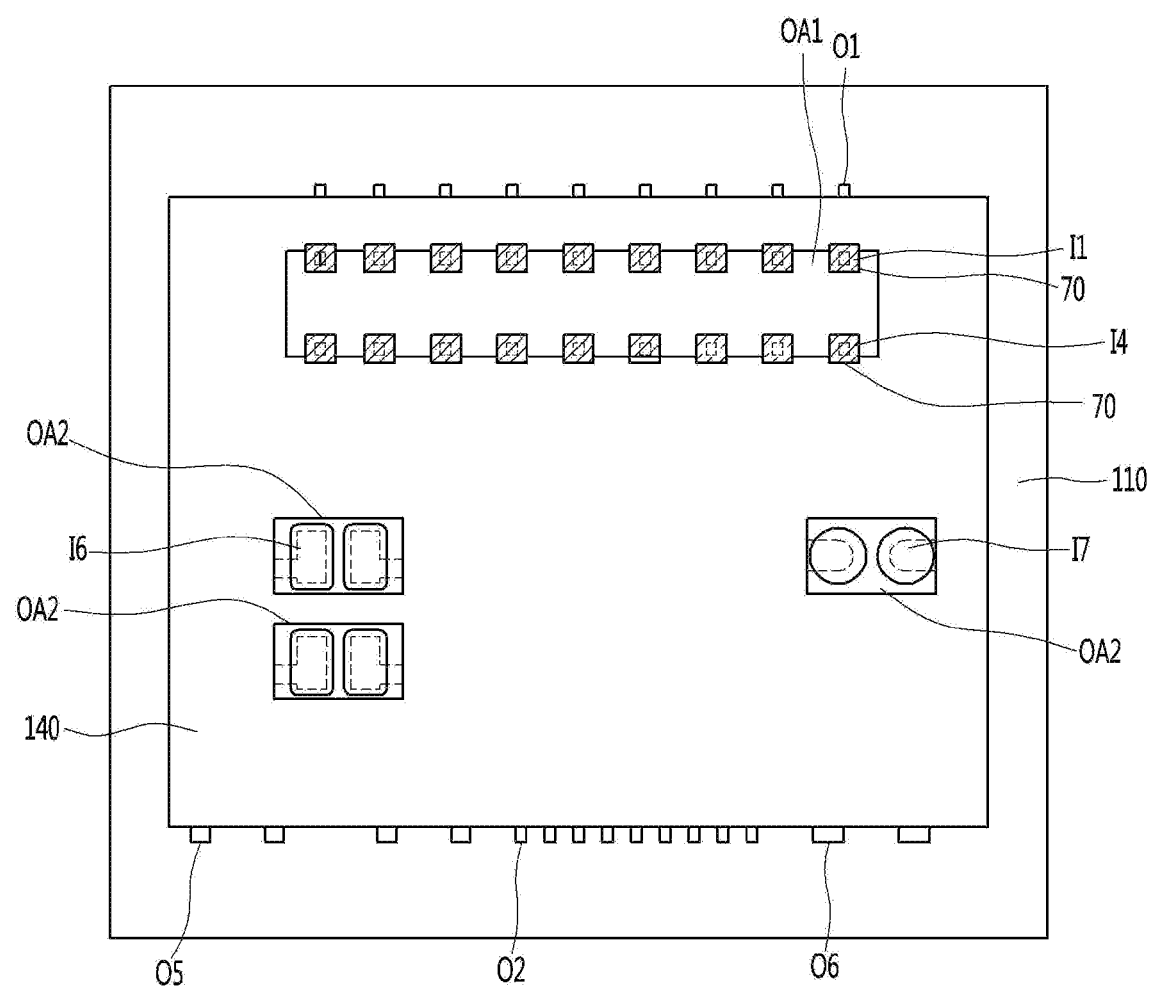

【FIG. 15A】
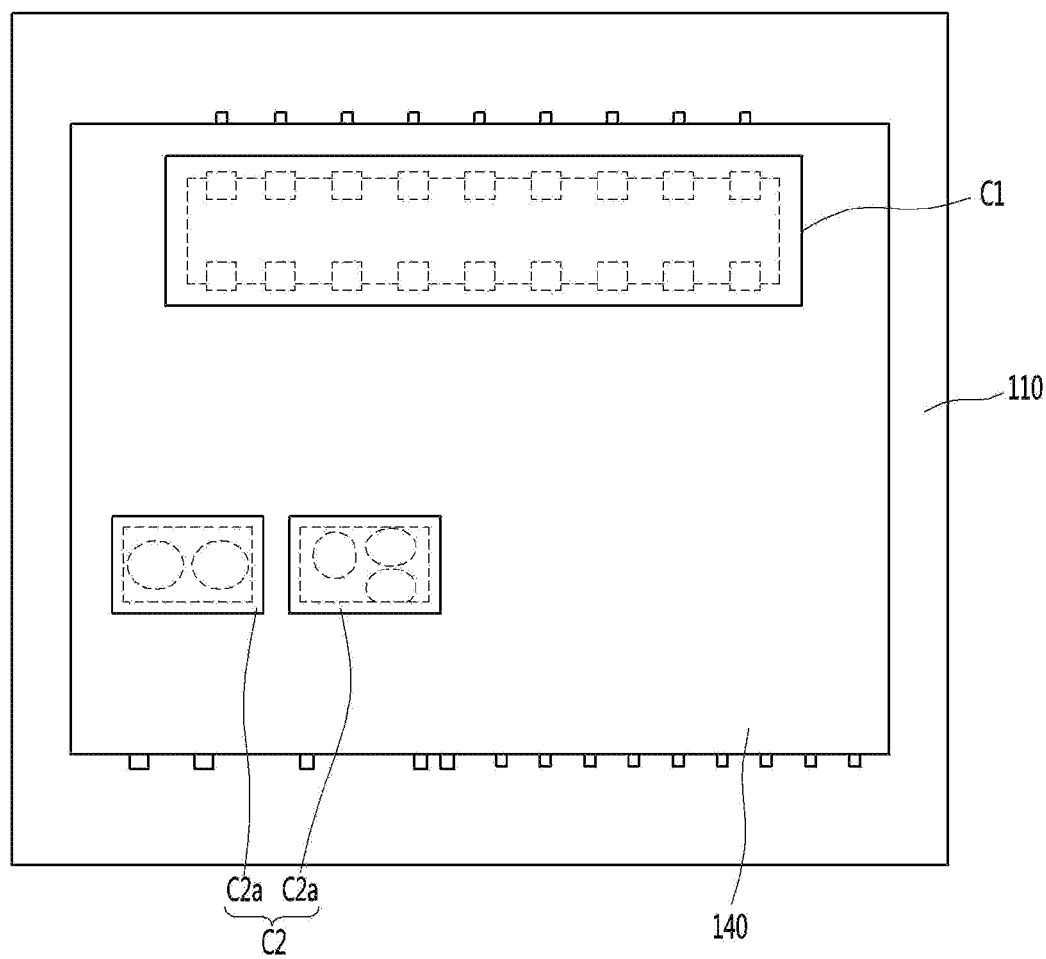

[FIG. 15B]
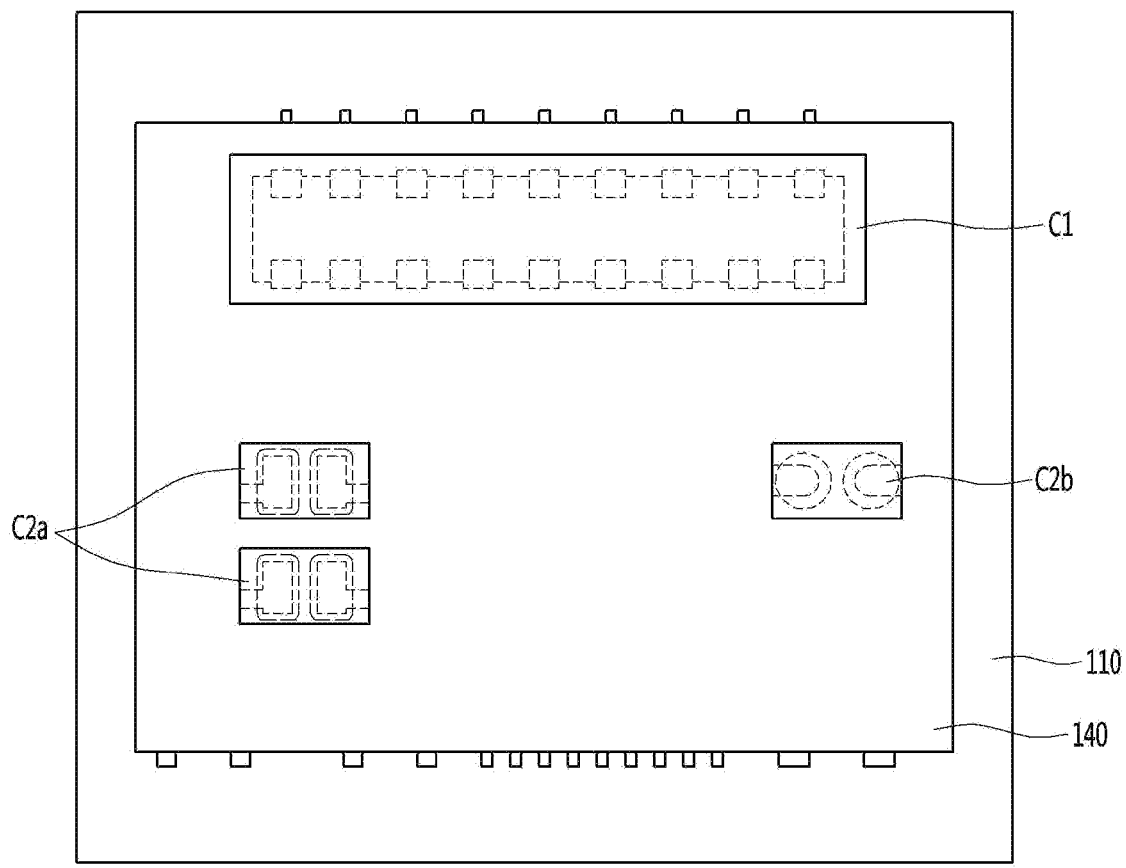
[FIG. 16]
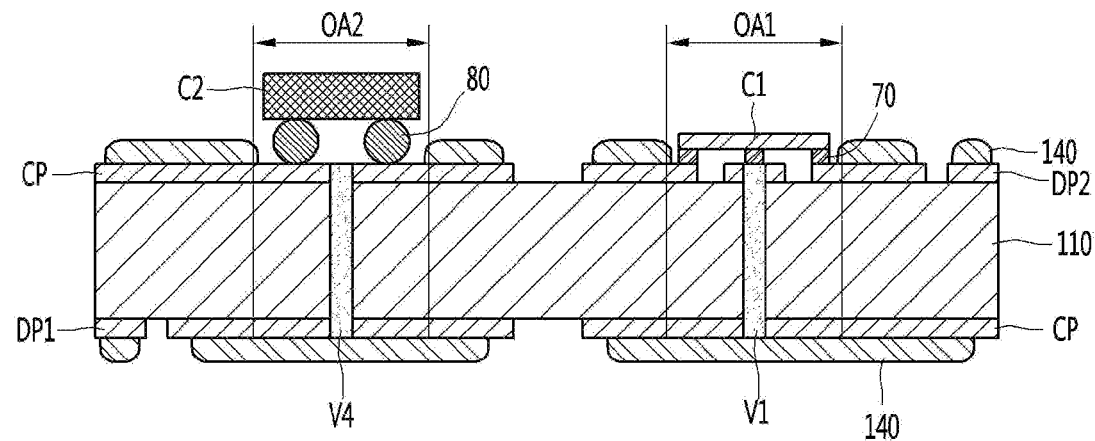

[FIG. 17]
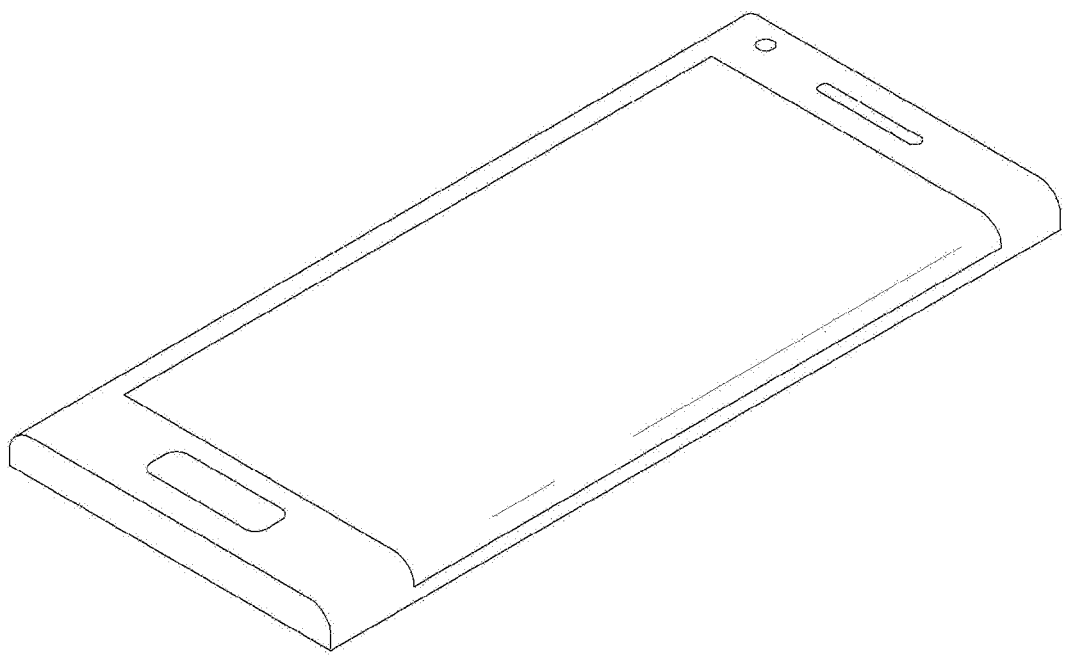

[FIG. 18]
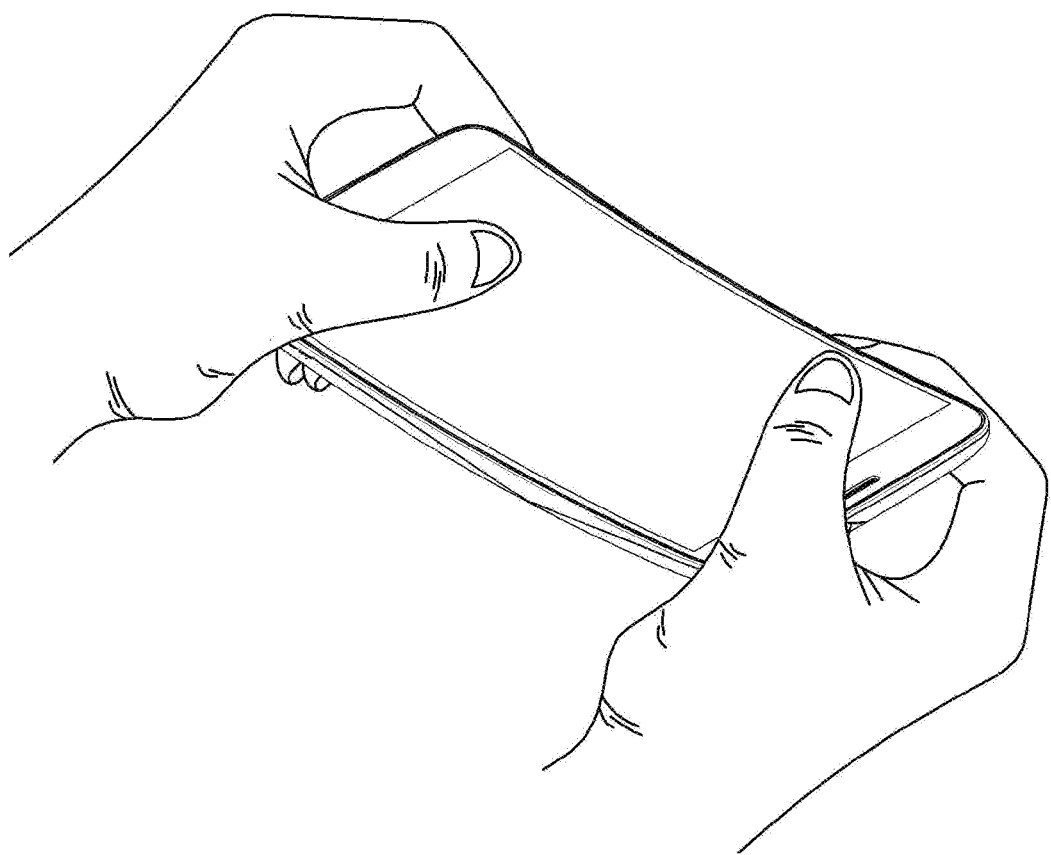

[FIG. 19A]
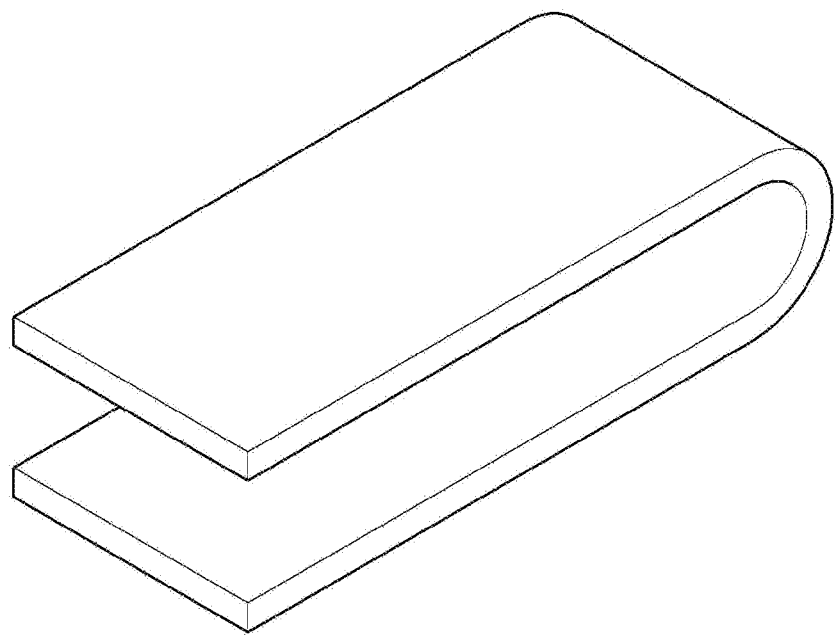
[FIG. 19B]
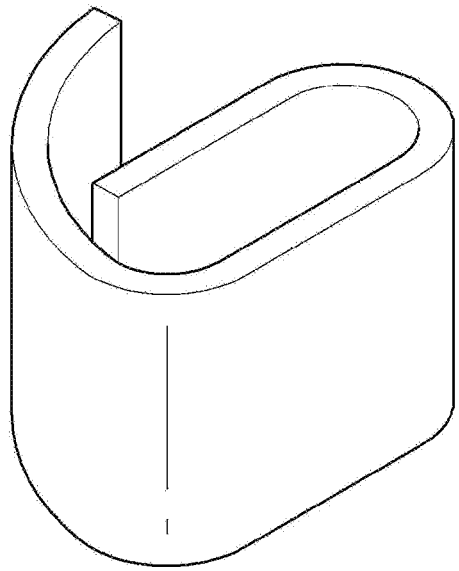

[FIG. 19C]
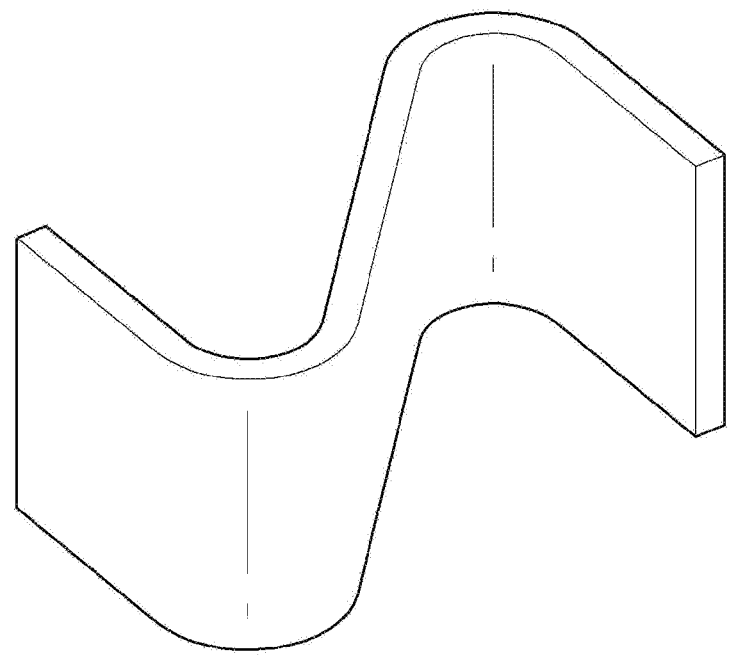
[FIG. 20]
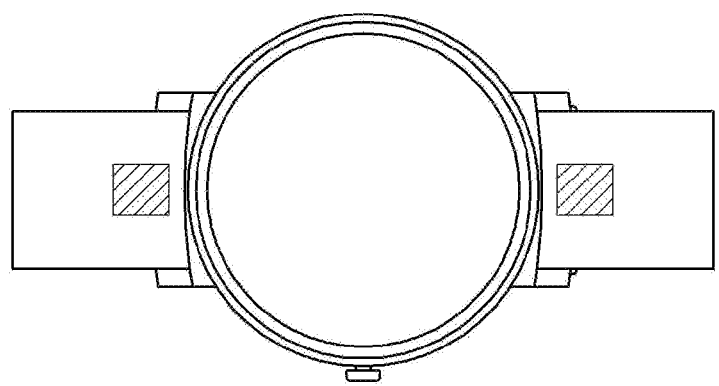

[FIG. 21]
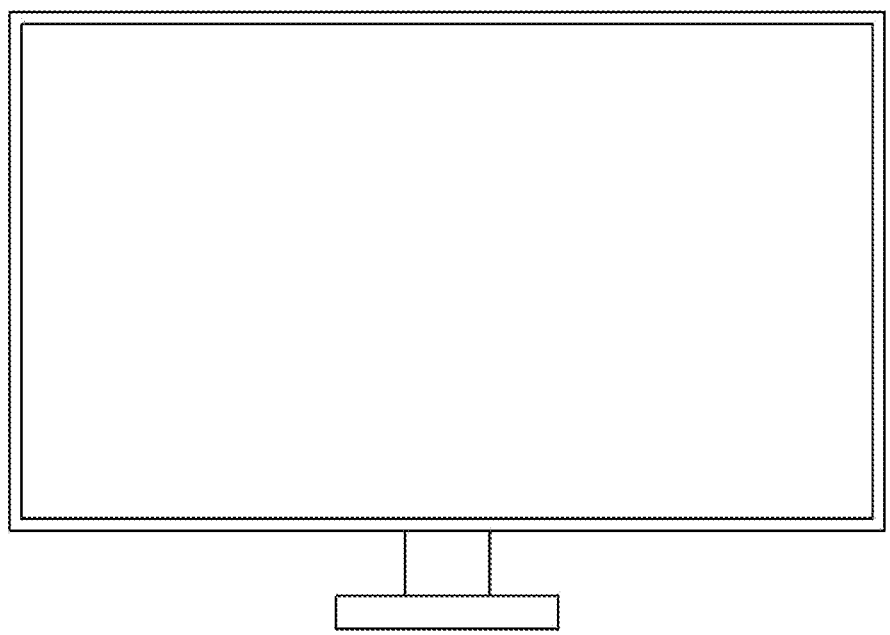

FLEXIBLE CIRCUIT BOARD AND CHIP PACKAGE INCLUDING SAME

CROSS-REFERENCE TO RELATED PATENT APPLICATIONS

This application is a Continuation of U.S. patent application Ser. No. 16/756,552, filed Apr. 16, 2020, which is a U.S. National Stage Application under 35 U.S.C. § 371 of PCT Application No. PCT/KR2018/012687, filed Oct. 25, 2018, which claims priority to Korean Patent Application No. 10-2017-0145443, filed Nov. 2, 2017, whose entire disclosures are hereby incorporated by reference.

TECHNICAL FIELD

An embodiment relates to a flexible circuit board for all-in-one chip on film and a chip package including the same.

Specifically, an embodiment relates to a flexible circuit board capable of mounting different types of chips on one substrate and a chip package including the same.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible circuit board in the form of a thin film. For example, the semiconductor chip may be an integrated circuit (IC) chip or a large-scale integrated circuit (LSI) chip Meanwhile, various chip-on-film package technologies using a flexible substrate have been proposed as a high-density semiconductor chip mounting technology in order to respond to the trend of smaller size, thinness, and lighter weight in recent electronic products.

DISCLOSURE

Technical Problem

An embodiment provides a flexible circuit board for all-in-one chip on film capable of mounting a plurality of chips on one substrate, a chip package including the same, and an electronic device including the same.

An embodiment provides a flexible circuit board for all-in-one chip on film capable of removing pinholes generated during solder resist printing, a chip package including the same, and an electronic device including the same.

An embodiment provides a flexible circuit board for all-in-one chip on film capable of designing a product in consideration of a solder resist printing process, a chip package including the same, and an electronic device including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A flexible circuit board according to an embodiment of the present invention includes: a substrate; a first wiring pattern layer disposed on a first surface of the substrate; a second wiring pattern layer disposed on a second surface opposite to the first surface of the substrate; a first dummy pattern part disposed on the second surface of the substrate in which the second wiring pattern layer is not disposed; a first protection layer disposed on the first wiring pattern layer; and a second protection layer disposed on the second wiring pattern layer and the first dummy pattern part, wherein at least a part of the first dummy pattern part is vertically overlapped with the first wiring pattern layer.

In addition, the flexible circuit board further includes a second dummy pattern part which is disposed on the first surface of the substrate in which the first wiring pattern layer is not disposed and at least a part of which is vertically overlapped with the second wiring pattern layer.

Further, the first dummy pattern part has the same width as the first wiring pattern layer, and one end thereof is disposed on the same vertical line as one end of the first wiring pattern layer.

Furthermore, the first dummy pattern part has a wider width than the first wiring pattern layer, and one end thereof is closer to one end of the substrate than one end of the first wiring pattern layer.

In addition, the first surface is an upper surface of the substrate, the second surface is a lower surface of the substrate, and the first dummy pattern part is disposed more to the left than the first wiring pattern layer disposed on the leftmost side of the first wiring pattern layer.

Further, the second dummy pattern part is disposed more to the right than the second wiring pattern layer disposed on the rightmost side of the second wiring pattern layer.

In addition, the flexible circuit board further includes: a first plating layer including tin (Sn) disposed on the first wiring pattern layer; and a second plating layer including tin (Sn) disposed on the second wiring pattern layer, wherein the first dummy pattern part includes a first dummy pattern layer corresponding to the second wiring pattern layer, and a second dummy pattern layer corresponding to the second plating layer, and the second dummy pattern part includes a third dummy pattern layer corresponding to the first wiring pattern layer, and a fourth dummy pattern layer corresponding to the first plating layer.

Meanwhile, a chip package according to an embodiment includes a flexible circuit board for all-in-one chip on film including: a substrate; a conductive pattern part disposed on the substrate; a dummy pattern part disposed on the substrate; and a protective part disposed on one region on the conductive pattern part and the dummy pattern part, wherein the conductive pattern part includes a first wiring pattern layer disposed on a first surface of the substrate, a first plating layer disposed on the first wiring pattern layer, a second wiring pattern layer disposed on a second surface opposite to the first surface of the substrate, a second plating layer disposed on the second wiring pattern layer, wherein a content of tin (Sn) of the plating layer in a first open region of the protection layer is greater than that of the plating layer in a second open region of the protection layer, and a first chip disposed in the first open region, and a second chip disposed in the second open region, wherein the dummy pattern part includes a first dummy pattern part which is disposed on the second surface of the substrate on which the second wiring pattern layer is not disposed and at least a part of which is vertically overlapped with the first wiring pattern layer, and a second dummy pattern part which is disposed on the first surface of the substrate on which the first wiring pattern layer is not disposed and at least a portion of which is vertically overlapped with the second wiring pattern layer.

In addition, the first surface is an upper surface of the substrate, the second surface is a lower surface of the substrate, the first dummy pattern part is disposed more to the left than the first wiring pattern layer disposed on the leftmost side of the first wiring pattern layer, and the second dummy pattern part is disposed more to the right than the second wiring pattern layer disposed on the rightmost side of the second wiring pattern layer.

In addition, the second chip is a drive IC chip, and the second chip includes at least one of a diode chip, a power supply IC chip, a touch sensor IC chip, a multilayer ceramic capacitor (MLCC) chip, a ball grid array (BGA) chip, and a chip condenser.

Meanwhile, an electronic device according to an embodiment of the present invention includes: a substrate; a conductive pattern part disposed on the substrate; a dummy pattern part disposed on the substrate; and a protective part disposed partially in one region on the conductive pattern part, wherein the conductive pattern part includes a first wiring pattern layer disposed on a first surface of the substrate, a first plating layer disposed on the first wiring pattern layer, a second wiring pattern layer disposed on a second surface opposite to the first surface of the substrate, a second plating layer disposed on the second wiring pattern layer, a flexible circuit board for all-in-one chip on film in which a content of tin (Sn) of the plating layer in a first open region of the protection layer is greater than that of the plating layer in a second open region of the protection layer; a display panel connected to one end of the flexible circuit board for all-in-one chip on film; and a main board connected to the other end of the flexible circuit board for all-in-one chip on film opposite to the one end, wherein the dummy pattern part includes a first dummy pattern part which is disposed on the second surface of the substrate on which the second wiring pattern layer is not disposed and at least a part of which is vertically overlapped with the first wiring pattern layer, and a second dummy pattern part disposed on the first surface of the substrate on which the first wiring pattern layer is not disposed and at least a part of which is vertically overlapped with the second wiring pattern layer.

In addition, a first connection part and a second connection part are disposed on a region different from the one region on the conductive pattern part, respectively, and a first chip is disposed on the first connection part and a second chip is disposed on the second connection part.

In addition, the display panel and the main board are disposed facing each other, and the flexible circuit board for all-in-one chip on film is disposed bending between the display panel and the main board.

Advantageous Effects

According to an embodiment of the present invention, different types of first and second chips may be mounted on one flexible circuit board, and thus the embodiment may provide a chip package including a flexible circuit board for all-in-one chip on film with improved reliability.

According to an embodiment of the present invention, a display panel and a main board are directly connected by one flexible circuit board for all-in-one chip on film, and thus a size and thickness of the flexible circuit board for transmitting a signal generated from the display panel to the main board may be reduced, and accordingly, it is possible to increase spaces of other components and/or a battery space.

According to an embodiment of the present invention, since connection of a plurality of printed circuit boards is not required, convenience of a process and reliability of electrical connection may be improved, and accordingly, it is possible to provide a flexible circuit board for all-in-one chip on film suitable for an electronic device having a high-resolution display unit.

In addition, according to an embodiment of the present invention, a dummy pattern is disposed at a second surface of a substrate to correspond to a circuit pattern disposed on a first surface of the substrate, and a dummy pattern is disposed at the first surface of the substrate so as to correspond to a circuit pattern disposed on the second surface of the substrate, and thus it is possible to solve a problem of solder resist not being applied or a problem of pinholes that occurs when printing the solder resist of the first surface or the second surface of the substrate.

DESCRIPTION OF DRAWINGS

FIG. 1A is a cross-sectional view of an electronic device including a display unit including a conventional printed circuit board.

FIG. 1B is a cross-sectional view of a form that the printed circuit board according to FIG. 1A is bent.

FIG. 1C is a plan view of a form that the printed circuit board according to FIG. 1A is bent.

FIG. 2A is a cross-sectional view of an electronic device including a display unit including a flexible circuit board for all-in-one chip on film according to an embodiment.

FIG. 2B is a cross-sectional view of a form that the flexible circuit board for all-in-one chip on film according to FIG. 2A is bent.

FIG. 2C is a plan view of a form that the flexible circuit board for all-in-one chip on film according to FIG. 2A is bent.

FIG. 3A is a cross-sectional view of a chip package including a double-side flexible circuit board for all-in-one chip on film according to an embodiment.

FIG. 3B is another cross-sectional view of a chip package including a double-side flexible circuit board for all-in-one chip on film according to an embodiment.

FIG. 4A is a cross-sectional view of a flexible circuit board not including a dummy pattern part according to a comparative example.

FIG. 4B is a cross-sectional view of a flexible circuit board including a lower dummy pattern part DP1 according to an embodiment of the present invention.

FIGS. 5A to 5D are views showing an example of various modifications of the lower dummy pattern part DP1 shown in FIG. 4B.

FIG. 6 is a view showing an upper dummy pattern part DP2 according to an embodiment of the present invention.

FIG. 7A is another cross-sectional view of a double-side flexible circuit board for all-in-one chip on film according to an embodiment.

FIG. 7B is a cross-sectional view of a chip package including a double-side flexible circuit board for all-in-one chip on film according to FIG. 7A.

FIG. 8 is still another cross-sectional view of a chip package including a double-side flexible circuit board for all-in-one chip on film according to an embodiment.

FIG. 9 is an enlarged cross-sectional view of one region of a double-side flexible circuit board for all-in-one chip on film according to an embodiment.

FIG. 10 is a plan view of the double-side flexible circuit board for all-in-one chip on film according to FIG. 7A.

FIG. 11 is a bottom view of the double-side flexible circuit board for all-in-one chip on film according to FIG. 7A.

FIGS. 12A and 12B are schematic plan views of a chip package including the double-side flexible circuit board for all-in-one chip on film according to FIG. 7B.

FIGS. 13A, 13B, 14A, 14B, 15A and 15B are views showing a process of manufacturing the double-side flexible circuit board for all-in-one chip on film according to FIG. 7A into a chip package including the double-side flexible circuit board for all-in-one chip on film according to FIG. 7B.

FIG. 16 is a cross-sectional view of a chip package including the double-side flexible circuit board for all-in-one chip on film according to FIGS. 15A and 15B.

FIGS. 17 to 21 are views of various electronic devices including a flexible circuit board for all-in-one chip on film.

MODES OF THE INVENTION

In the description of embodiments, when it is described that each layer (film), region, pattern, or structure is formed "above/on" or "below/under" a substrate, each layer (film), region, pad or pattern, the description includes being formed both "directly" or "indirectly (by interposing another layer)" "above/on" or "below/under". A reference of above/on or below/under of each layer will be described with reference to the drawings In addition, when a certain part is referred to as being "connected" to another part, it includes not only "directly connected" but also "indirectly connected" with another member therebetween. Further, when a certain part "includes" a certain component, unless described to the contrary, this means that other components may not be excluded, but other components may be further provided.

In the drawings, a thickness or a size of each layer (film), region, pattern or structure may be modified for clarity and convenience of explanation, and thus does not entirely reflect the actual size Hereinafter, embodiments of the present disclosure will be described in detail with reference to the accompanying drawings.

A printed circuit board according to a comparative example will be described with reference to FIGS. 1A to 1C.

An electronic device having a display unit requires at least two printed circuit boards to transmit display panel signals to a main board.

There may be at least two printed circuit boards included in the electronic device including the display unit according to the comparative example.

The electronic device including the display unit according to the comparative example may include a first printed circuit board 10 and a second printed circuit board 20.

The first printed circuit board 10 may be a flexible printed circuit board. Specifically, the first printed circuit board 10 may be a flexible printed circuit board for chip on film (COF). The first printed circuit board 10 may be a COF flexible printed circuit board on which a first chip C1 is mounted. More specifically, the first printed circuit board 10 may be a COF flexible printed circuit board for disposing a drive IC chip.

The second printed circuit board 20 may be a flexible printed circuit board. Specifically, the second printed circuit board 20 may be a flexible printed circuit board (FPCB) for disposing a second chip C2 which is a different type from that of the first chip C1. Here, the second chip C2 is other than the drive IC chip, and another chip excluding the drive IC chip. It may refer to various chips such as a semiconductor element, a socket, and the like, which are disposed on the flexible printed circuit board for electrical connection. The second printed circuit board 20 may be a flexible printed circuit board (FPCB) for disposing a plurality of second chips C2. For example, the second printed circuit board 20 may be a flexible printed circuit board for disposing a plurality of second chips C2A and C2B which are different types.

The first printed circuit board 10 and the second printed circuit board 20 may have different thicknesses. A thickness of the second printed circuit board 20 may be smaller than that of the first printed circuit board 10. For example, the first printed circuit board 10 may have a thickness of about 20 μm to 100 μm. The second printed circuit board 20 may have a thickness of about 100 μm to 200 μm. For example, a total thickness t1 of the first printed circuit board 10 and the second printed circuit board may be 200 μm to 250 μm.

In the electronic device including the display unit according to a comparative example, the first and second printed circuit boards are required between the display panel and the main board, and thus an overall thickness of the electronic device may be increased. Specifically, the electronic device including the display unit according to the comparative example requires the first and second printed circuit boards stacked vertically, and thus the overall thickness of the electronic device may be increased.

The first printed circuit board 10 and the second printed circuit board 20 may be formed by different processes. For example, the first printed circuit board 10 may be manufactured by a roll-to-roll process. The second printed circuit board 20 may be manufactured by using a sheet method.

Different types of chips are disposed on the first printed circuit board 10 and the second printed circuit board 20, respectively, and a pitch of a conductive pattern part for connection with each of chips may be different from each other. For example, a pitch of a conductive pattern part disposed on the second printed circuit board 20 may be greater than that of a conductive pattern part disposed on the first printed circuit board 10. For example, the pitch of the conductive pattern part disposed on the second printed circuit board 20 is 100 μm or more, and the pitch of the conductive pattern part disposed on the first printed circuit board 10 may be less than 100 μm.

Specifically, the first printed circuit board 10 having a conductive pattern part disposed at a fine pitch may be process-efficiently manufactured and reduce a process cost by a roll-to-roll process. On the other hand, the second printed circuit board 20 having a conductive pattern part disposed at a pitch of 100 μm or more is difficult to apply the roll-to-roll process, and thus has been generally manufactured in a sheet process.

Since the first and second printed circuit boards according to the comparative example are formed in different processes, process efficiency may be lowered.

In addition, since the chip package including the flexible circuit board according to the comparative example has difficulty in a process of disposing different types of chips on one substrate, separate first and second printed circuit boards are required.

Further, the chip package including the flexible circuit board according to the comparative example has a problem that it is difficult to connect different types of chips on one substrate.

Furthermore, in the flexible circuit board according to the comparative example, an upper circuit pattern and a lower circuit pattern are designed in consideration of only their respective signal transmission characteristics. In other words, in the flexible circuit board according to the comparative example, the upper circuit pattern and the lower circuit pattern are designed without considering the reliability of a printing process of a protection layer (for example, solder resist) disposed on the outermost layer of a substrate. Therefore, in the flexible circuit board according to the comparative example, the protection layer has a problem that a pin-hole is generated due to a positional difference between the upper circuit pattern and the lower circuit pattern in the printing process.

Meanwhile, the first and second printed circuit boards may be disposed between the conventional display panel and main board.

In order to control, process, or transmit R, G, and B signals generated from a display panel 30, the first printed circuit board 10 may be connected to the display panel 30, the first printed circuit board 10 may be again connected to the second printed circuit board 20, and the second printed circuit board 20 may be connected to a main board 40.

One end of the first printed circuit board 10 may be connected to the display panel 30. The display panel 30 may be connected to the first printed circuit board 10 by an adhesive layer 50.

The other end opposite to the one end of the first printed circuit board 10 may be connected to the second printed circuit board 20. The first printed circuit board 10 may be connected to the second printed circuit board 20 by the adhesive layer 50.

One end of the second printed circuit board 20 may be connected to the first printed circuit board 10, and the other end opposite to the one end of the second printed circuit board 20 may be connected to the main board 40. The second printed circuit board 20 may be connected to the main board 40 by the adhesive layer 50.

In the electronic device including the display unit according to the comparative example, a separate adhesive layer 50 may be respectively required between the display panel 30 and the first printed circuit board 10, the first printed circuit board 10 and the second printed circuit board 20, and the second printed circuit board 20 and the main board 40. That is, in the electronic device including the display unit according to the comparative example, a plurality of adhesive layers are required, and thus there is a problem that reliability of the electronic device may be lowered due to poor connection of the adhesive layer. In addition, the adhesive layer disposed between the first printed circuit board 10 and the second printed circuit board 20 connected vertically may increase the thickness of the electronic device.

A first printed circuit board 10, a second printed circuit board 20, a display panel 30, and a main board 40 housed in an electronic device according to a comparative example will be described with reference to FIGS. 1B and 1C.

FIG. 1B is a cross-sectional view of a form that the printed circuit board according to FIG. 1A is bent, and FIG. 1C is a plan view of a lower surface of FIG. 1B.

The display panel 30 and the main board 40 may be disposed to face each other. The first printed circuit board 10 including a bending region may be disposed between the display panel 30 and the main board 40 disposed to face each other.

One region of the first printed circuit board 10 is bent, and the first chip C1 may be disposed in a region thereof which is not bent.

In addition, the second printed circuit board 20 may be disposed to face the display panel 30. The second chip C2 may be disposed in an unbending region of the second printed circuit board 20.

Referring to FIG. 1C, since the comparative example requires a plurality of substrates, a length L1 in one direction may be a sum of lengths of the first printed circuit board 10 and the second printed circuit board 20, respectively. The length L1 in one direction of the first printed circuit board 10 and the second printed circuit board 20 may be a sum of a short side length of the first printed circuit board 10 and a short side length of the second printed circuit board 20. As an example, the length L1 in one direction of the first printed circuit board 10 and the second printed circuit board 20 may be 30 mm to 40 mm. However, the length L1 in one direction of the first printed circuit board 10 and the second printed circuit board 20 may have various sizes depending on a type of chip to be mounted and a type of electronic device.

In the electronic device according to the comparative example, since a plurality of printed circuit boards are required, a space for mounting another component or a space for disposing a battery 60 may be reduced.

Recently, a component having various functions have been added to an electronic device such as a smartphone in order to enhance user convenience and security. For example, electronic devices such as smartphones and smart watches are equipped with a plurality of camera modules (dual camera module, dual camera module), and a component having various functions such as iris recognition and virtual reality (VR) is added. Accordingly, it is important to secure a space for mounting the added component.

In addition, various electronic devices such as wearable devices are required to increase a battery space in order to improve user convenience.

Therefore, a plurality of printed circuit boards used in conventional electronic devices are replaced with a single printed circuit board, and thus importance of securing a space for mounting a new component or securing a space for increasing a battery size is emerged.

In the electronic device according to the comparative example, different types of the first chip and the second chip may be disposed on the first printed circuit board 10 and second printed circuit board 30, respectively. Accordingly, there was a problem that a thickness of the adhesive layer 50 between the first printed circuit board 10 and the second printed circuit board 30 and a thickness of the second printed circuit board 30 increase a thickness of the electronic device.

In addition, there was a problem that a battery space corresponding to a size of the second printed circuit board 30 or a space for mounting other components is reduced.

Further, there was a problem that poor bonding between the first and second printed circuit boards deteriorates reliability of the electronic device.

In order to solve such problems, embodiments may provide a new flexible circuit board for all-in-one chip on film capable of mounting a plurality of chips on one substrate, a chip package including the same, and an electronic device including the same. The same drawing numerals in the embodiments and the comparative examples indicate the same components, and redundant description with the comparative examples described above is omitted.

An electronic device including a flexible circuit board for all-in-one chip on film according to an embodiment will be described with reference to FIGS. 2A to 2C.

The electronic device according to the embodiment may use one printed circuit board in order to transmit a display panel signal to a main board. The printed circuit board included in the electronic device including a display unit according to the embodiment may be one flexible printed circuit board. Accordingly, a flexible circuit board 100 for all-in-one chip on film according to the embodiment may be bent between the display unit and the main board facing each other to connect the display unit and the main board.

Specifically, the flexible circuit board 100 for all-in-one chip on film according to the embodiment may be one substrate for disposing a plurality of different types of chips.

The flexible circuit board 100 for all-in-one chip on film according to the embodiment may be a substrate for disposing different types of a first chip C1 and a second chip C2.

A thickness t2 of the flexible circuit board 100 for all-in-one chip on film according to the embodiment may be 20 μm to 100 μm. For example, the thickness t2 of the flexible circuit board 100 for all-in-one chip on film according to the embodiment may be 30 μm to 80 μm. For example, the thickness t2 of the flexible circuit board 100 for all-in-one chip on film according to the embodiment may be 50 μm to 75 μm. However, the thickness of the flexible circuit board 100 for all-in-one chip on film according to the embodiment may be designed in various sizes depending on a type of a chip and a type of an electronic device to be mounted.

Here, when the thickness t2 of the flexible circuit board 100 is less than 20 μm, the flexible circuit board 100 may be broken when it is folded (or bent), and damage may occur due to heat or the like generated in a mounted chip.

A thickness t2 of the flexible circuit board 100 for all-in-one chip on film according to the embodiment may have a thickness of ⅕ to ½ level of the thickness t1 of the plurality of first and second printed circuit boards according to the comparative example. That is, the thickness t2 of the flexible circuit board 100 for all-in-one chip on film according to the embodiment may have a thickness of 20% to 50% level of the thickness t1 of the plurality of first and second printed circuit boards according to the comparative example. For example, the thickness t2 of the flexible circuit board 100 for all-in-one chip on film according to the embodiment may have a thickness of 25% to 40% level of the thickness t1 of the plurality of first and second printed circuit boards according to the comparative example. For example, the thickness t2 of the flexible circuit board 100 for all-in-one chip on film according to the embodiment may have a thickness of 25% to 35% level of the thickness t1 of the plurality of first and second printed circuit boards according to the comparative example.

Since the electronic device including the display unit according to the embodiment requires only one flexible circuit board 100 for all-in-one chip on film between the display panel and the main board, the overall thickness of the electronic device may be reduced. Specifically, since the electronic device including the display unit according to the embodiment requires a single-layer printed circuit board, the overall thickness of the electronic device may be reduced.

In addition, the embodiment may omit the adhesive layer 50 between the first printed circuit board and the second printed circuit board included in the comparative example, and thus the overall thickness of the chip package including the flexible circuit board for all-in-one chip on film and the electronic device including same may be reduced.

Further, since the embodiment may omit the adhesive layer 50 between the first printed circuit board and the second printed circuit board, a problem due to the adhesion failure may be solved, thereby improving reliability of the electronic device.

Furthermore, since a bonding process of a plurality of printed circuit boards may be omitted, process efficiency may be increased and a process cost may be reduced.

Furthermore, management of the substrate in a separate process is replaced by management in one process, thereby improving the process efficiency and the product yield.

The flexible circuit board 100 for all-in-one chip on film according to the embodiment may include a bending region and a non-bending region. The flexible circuit board 100 for all-in-one chip on film according to the embodiment includes the bending region, thereby connecting the display panel 30 and the main board 40 that are disposed to face each other.

The non-bending region of the flexible circuit board 100 for all-in-one chip on film according to the embodiment may be disposed to face the display panel 30. The first chip C1 and the second chip C2 may be disposed on the non-bending region of the flexible circuit board 100 for all-in-one chip on film according to the embodiment. Accordingly, the flexible circuit board 100 for all-in-one chip on film according to the embodiment may stably mount the first chip C1 and the second chip C2.

FIG. 2C is a plan view of a lower surface in FIG. 2B.

Referring to FIG. 2C, since an embodiment requires one substrate, a length L2 in one direction may be a length of one substrate. The length L2 in one direction of a flexible circuit board 100 for all-in-one chip on film according to the embodiment may be a length of a short side of the flexible circuit board 100 for all-in-one chip on film according to the embodiment. As an example, the length L2 in one direction of the flexible circuit board 100 for all-in-one chip on film according to the embodiment may be 10 mm to 50 mm. For example, the length L2 in one direction of the flexible circuit board 100 for all-in-one chip on film according to the embodiment may be 10 mm to 30 mm. For example, the length L2 in one direction of the flexible circuit board 100 for all-in-one chip on film according to the embodiment may be 15 mm to 25 mm. However, the embodiment is not limited thereto, and it is needless to say that various sizes may be designed according to the type and/or number of chips to be disposed and the type of an electronic device. The length of the flexible circuit board may be reduced to 50 mm or less by mounting a plurality of chips on one board as in the embodiment. When the length of the flexible circuit board is set to 10 mm or less, the degree of freedom in designing of the plurality of chips to be mounted is reduced, and a space between the chips is narrow, and thus mutual electrical characteristics may be affected A length L2 in one direction of the flexible circuit board 100 for all-in-one chip on film according to the embodiment may have a length of 50% to 70% level of a length L1 in one direction of the plurality of first and second printed circuit boards according to the comparative example. For example, the length L2 in one direction of the flexible circuit board 100 for all-in-one chip on film according to the embodiment may have a length of 55% to 70% level of the length L1 in one direction of the plurality of first and second printed circuit boards according to the comparative example. The length L2 in one direction of the flexible circuit board 100 for all-in-one chip on film according to the embodiment may have a length of 60% to 70% level of the length L1 in one direction of the plurality of first and second printed circuit boards according to the comparative example.

Accordingly, in the embodiment, a size of a chip package including the flexible circuit board 100 for all-in-one chip on film in the electronic device may be reduced, so that a space for disposing a battery 60 may be increased. In addition, the chip package including the flexible circuit board 100 for all-in-one chip on film according to the embodiment may reduce a plane area, so that a space for mounting other components may be secured.

Hereinafter, a flexible circuit board 100 for all-in-one chip on film according to an embodiment and a chip package thereof will be described with reference to the drawings.

FIG. 3A is a cross-sectional view of a flexible circuit board according to a first embodiment of the present invention, FIG. 3B is a modified example of the flexible circuit board of FIG. 3A, FIG. 4A is a cross-sectional view of a flexible circuit board not including a dummy pattern part according to a comparative example, FIG. 4B is a cross-sectional view of a flexible circuit board including a lower dummy pattern part DP1 according to an embodiment of the present invention, FIGS. 5A to 5D are views showing an example of various modifications of the lower dummy pattern part DP1 shown in FIG. 4B, FIG. 6 is a view showing an upper dummy pattern part DP2 according to an embodiment of the present invention, FIG. 7A is another cross-sectional view of a double-side flexible circuit board for all-in-one chip on film according to an embodiment, FIG. 7B is a cross-sectional view of a chip package including a double-side flexible circuit board for all-in-one chip on film according to FIG. 7A, and FIG. 8 is still another cross-sectional view of a chip package including a double-side flexible circuit board for all-in-one chip on film according to an embodiment.

Referring to FIGS. 3A, 3B, 4A, 4B, 5A, 5B, 5C, 5D, 6, 7A, 7B, and 8, the flexible circuit board 100 for all-in-one chip on film according to the embodiment may be a double-side flexible circuit board for all-in-one chip on film having electrode pattern parts on both sides thereof.

The flexible circuit board 100 for all-in-one chip on film according to the embodiment may include a substrate 110, a wiring pattern layer 120 disposed on the substrate 110, a plating layer 130, an upper dummy pattern part DP2, a lower dummy pattern part DP1, and a protection layer 140.

After the wiring pattern layer 120, the plating layer 130, the upper dummy pattern part DP2, and the protection layer 140 are disposed on one surface of the substrate 110 according to the embodiment, the wiring pattern layer 120, the plating layer 130, the lower dummy pattern part DP1, and the protection layer 140 are disposed on the other surface opposite to the one surface of the substrate 110.

That is, an upper wiring pattern layer, an upper plating layer, the upper dummy pattern part DP2, and an upper protection layer may be disposed on one surface of the substrate 110 according to the embodiment, and a lower wiring pattern layer, a lower plating layer, the lower dummy pattern part DP1, and a lower protection layer are disposed on the other surface opposite to the one surface of the substrate 110.

The upper wiring pattern layer may include a metal material corresponding to the lower wiring pattern layer. Accordingly, process efficiency may be improved. However, it is needless to say that the embodiment is not limited thereto, and may include other conductive materials.

A thickness of the upper wiring pattern layer may correspond to a thickness of the lower wiring pattern layer. Accordingly, process efficiency may be improved.

The upper plating layer may include a metal material corresponding to the lower plating layer. Accordingly, process efficiency may be improved. However, it is needless to say that the embodiment is not limited thereto, and may include other conductive materials.

A thickness of the upper plating layer may correspond to a thickness of the lower plating layer. Accordingly, process efficiency may be improved.

The upper dummy pattern part DP2 is disposed at a position corresponding to the lower wiring pattern layer disposed on a lower surface of the substrate 110 of the upper surface of the substrate 110, and the lower dummy pattern part DP1 is disposed at a position corresponding to the upper wiring pattern layer disposed on the upper surface of the substrate 110 of the lower surface of the substrate 110. Accordingly, in the present invention, a pin-hole problem caused by a difference in height of the upper and lower portions of the substrate 110 in a printing process of the upper protection layer or the lower protection layer may be solved, thereby improving reliability of a printed circuit board.

The substrate 110 may be a supporting substrate for supporting the wiring pattern layer 120, the plating layer 130, and the protection layer 140.

The first substrate 110 may include a bending region and a region other than the bending region. That is, the substrate 110 may include a bending region in which bending is performed and a non-bending region other than the folding region The substrate 110 may be a flexible substrate. Accordingly, the substrate 110 may be partially bent. That is, the substrate 110 may include a flexible plastic. For example, the substrate 110 may be a polyimide (PI) substrate. However, the embodiment is not limited thereto, and may be a substrate made of a polymer material such as polyethylene terephthalate (PET), polyethylene naphthalate (PEN), or the like. Accordingly, a flexible circuit board including the substrate 110 may be used in various electronic devices having a curved display device. For example, a flexible circuit board including the substrate 110 is excellent in flexible characteristics, thereby having suitability of mounting a semiconductor chip on a wearable electronic device. In particular, the embodiment may be suitable for an electronic device including a curved display.

The substrate 110 may be an insulating substrate. That is, the substrate 110 may be an insulating substrate supporting various wiring patterns.

The substrate 110 may have a thickness of 20 μm to 100 μm. For example, the substrate 110 may have a thickness of 25 μm to 50 μm. For example, the substrate 100 may have a thickness of 30 μm to 40 μm. When the thickness of the substrate 100 exceeds 100 μm, the thickness of the entire flexible circuit board may be increased. When the thickness of the substrate 100 is less than 20 μm, it may be difficult to dispose the first chip C1 and the second chip C2 at the same time. When the thickness of the substrate 110 is less than 20 μm, the substrate 110 may be vulnerable to heat/pressure in a process of mounting a plurality of chips, and thus it is difficult to dispose the plurality of chips at the same time. A wiring may be disposed on the substrate 110. The wiring may be a plurality of patterned wirings. For example, the plurality of wirings on the substrate 110 may be disposed to be spaced apart from each other. That is, a wiring pattern layer 120 may be disposed on one surface of the substrate 110.

An area of the substrate 110 may be larger than that of the wiring pattern layer 120. Specifically, a planar area of the substrate 110 may be larger than that of the wiring pattern layer 120. That is, the wiring pattern layer 120 may be partially disposed on the substrate 110. For example, a lower surface of the wiring pattern layer 120 may be in contact with the substrate 110, and the substrate 110 may be exposed between the plurality of wirings. The wiring pattern layer 120 may include a conductive material.

The substrate 110 may include a through-hole. The substrate 110 may include a plurality of through-holes. The plurality of through-holes of the substrate 110 may be formed individually or simultaneously by a mechanical process or a chemical process. For example, the plurality of through-holes of the substrate 110 may be formed by a drilling process or an etching process. As an example, the through-holes of the substrate may be formed through laser punching and desmearing processes. The desmearing process may be a process of removing a polyimide smear attached to an inner surface of the through-hole. By the desmearing process, an inner surface of the polyimide substrate may have an inclined surface similar to a straight line.

The wiring pattern layer 120, the plating layer 130, and the protection layer 140 may be disposed on the substrate 110. In detail, the wiring pattern layer 120, the plating layer 130, and the protection layer 140 may be sequentially disposed on both surfaces of the substrate 110. At this time, the dummy pattern parts DP1 and DP2 have heights corresponding to the wiring pattern layer 120 and the plating layer 130. Preferably, the dummy pattern parts DP1 and DP2 in the first embodiment of the present invention are formed of the same metal material as the wiring pattern layer 120, and may have a greater thickness than the wiring pattern layer 120. Preferably, the dummy pattern parts DP1 and DP2 may have a thickness obtained by combining the thickness of the wiring pattern layer 120 and the thickness of the plating layer 130.

The wiring pattern layer 120 may be formed by at least one method of evaporation, plating, and sputtering.

As an example, a wiring layer for forming a circuit may be formed by electrolytic plating after sputtering. For example, a wiring layer for forming a circuit may be a copper plating layer formed by electroless plating. Alternatively, the wiring layer may be a copper plating layer formed by electroless plating and electrolytic plating.

Next, a patterned wiring layer may be formed on both surfaces of a flexible circuit board, that is, on the upper and lower surfaces, after laminating a dry film on the wiring layer, through the processes of exposure, development, and etching. And thus the wiring pattern layer 120 may be formed.

For example, the wiring pattern layer 200 may include a metal material having excellent electrical conductivity. More specifically, the wiring pattern layer 200 may include copper (Cu). However, the embodiment is not limited thereto, and it is possible to include at least one metal among copper (Cu), aluminum (Al), chromium (Cr), nickel (Ni), silver (Ag), molybdenum (Mo), gold (Au), titanium (Ti), and an alloy thereof.

The wiring pattern layer 120 may be disposed to have a thickness of 1 μm to 15 μm. For example, the wiring pattern layer 120 may be disposed to have a thickness of 1 μm to 10 μm. For example, the wiring pattern layer 120 may be disposed to have a thickness of 2 μm to 10 μm.

When the thickness of the wiring pattern layer 120 is less than 1 μm, a resistance of the wiring pattern layer may increase. When the thickness of the wiring pattern layer 120 exceeds 10 μm, it is difficult to realize a fine pattern.

Conductive materials may be filled in via holes V1, V2, and V3 passing through the substrate 110. The conductive material filled in a via hole may correspond to the wiring pattern layer 120, or may be different conductive materials. For example, the conductive material filled in a via hole may include at least one metal among copper (Cu), aluminum (Al), chromium (Cr), nickel (Ni), silver (Ag), molybdenum (Mo), gold (Au), titanium (Ti), and an alloy thereof. The electrical signal of a conductive pattern part CP on the upper surface of the substrate 110 may be transmitted to the conductive pattern part CP of the lower surface of the substrate 110 through the conductive material filled in a via hole.

Next, a plating layer 130 may be formed on the wiring pattern layer 120. The plating layer 130 may include a first plating layer 131 and a second plating layer 132.

The first plating layer 131 may be disposed on the wiring pattern layer 120, and the second plating layer 132 may be disposed on the first plating layer 131. The first plating layer 131 and the second plating layer 132 may be formed in two layers on the wiring pattern layer 120 in order to prevent formation of whiskers. Accordingly, a short circuit between patterns of the wiring pattern layer 120 may be prevented. In addition, since two plating layers are disposed on the wiring pattern layer 120, bonding characteristics with the chip may be improved. When the wiring pattern layer includes copper (Cu), the wiring pattern layer may not be directly bonded to the first chip C1, and a separate bonding process may be required. On the other hand, when the plating layer disposed on the wiring pattern layer includes tin (Sn), a surface of the plating layer may be a pure tin layer, and thus bonding with the first chip C1 may be facilitated. At this time, a wire connected to the first chip C1 may be simply connected to the pure tin layer only by heat and pressure, and thus accuracy of wire bonding of the chip and convenience of a manufacturing process may be improved.

A region in which the first plating layer 131 is disposed may correspond to a region in which the second plating layer 132 is disposed. That is, an area in which the first plating layer 131 is disposed may correspond to an area in which the second plating layer 132 is disposed.

The plating layer 130 may include tin (Sn). For example, the first plating layer 131 and the second plating layer 132 may include tin (Sn).

As an example, the wiring pattern layer 120 may be formed of copper (Cu), and the first plating layer 131 and the second plating layer 132 may be formed of tin (Sn). When the plating layer 130 includes tin, corrosion resistance of tin (Sn) is excellent, and thus the wiring pattern layer 120 may be prevented from being oxidized.

Meanwhile, a material of the plating layer 130 may have a lower electrical conductivity than that of the wiring electrode layer 120. The plating layer 130 may be electrically connected to the wiring electrode layer 120.

The first plating layer 131 and the second plating layer 132 may be formed of the same tin (Sn), but may be formed in a separate process.

For example, when the manufacturing process of a flexible circuit board according to the embodiment includes a heat treatment process such as thermal curing, a diffusion action of copper (Cu) of the wiring pattern layer 120 or tin (Sn) of the plating layer 130 may occur. Specifically, the diffusion action of copper (Cu) of the wiring pattern layer 120 or tin (Sn) of the plating layer 130 may occur by curing of the protection layer 140.

Accordingly, as the diffusion concentration of copper (Cu) decreases from the first plating layer 131 to a surface of the second plating layer 132, a content of copper (Cu) may be continuously reduced. Meanwhile, the content of tin (Sn) may continuously increase from the first plating layer 131 to the surface of the second plating layer 132. Accordingly, the uppermost portion of the plating layer 130 may include a pure tin layer.

That is, the wiring pattern layer 120 and the plating layer 130 may be an alloy of tin and copper due to a chemical action at a stacking interface. The thickness of the alloy of tin and copper after the protection layer 140 is cured on the plating layer 130 may be increased than the thickness of the alloy of tin and copper after the plating layer 130 is formed on the wiring pattern layer 120.

An alloy of tin and copper included in at least a part of the plating layer 130 may have a chemical formula of $Cu_xSn_y$, and may be $0<x+y<12$. For example, in the chemical formula, a sum of x and y may be $4 \leq x+y \leq 11$. For example, the alloy of tin and copper included in the plating layer 130 may include at least one of $Cu_3Sn$ and $Cu_6Sn_5$. Specifically, the first plating layer 131 may be an alloy layer of tin and copper.

In addition, the first plating layer 131 and the second plating layer 132 may have different contents of tin and copper. The first plating layer 131 in direct contact with the copper wiring pattern layer may have a copper content greater than that of the second plating layer 132.

The second plating layer 132 may have a higher tin content than the first plating layer 131. The second plating layer 132 may include a pure tin layer. Here, pure tin may mean that a content of tin (Sn) is 50 atomic % or more, 70 atomic % or more, or 90 atomic % or more. At this time, an element other than tin may be copper. For example, the second plating layer 132 may have a tin (Sn) content of 50 atomic % or more. For example, the second plating layer 132 may have a tin (Sn) content of 70 atomic % or more. For example, the second plating layer 132 may have a tin (Sn) content of 90 atomic % or more. For example, the second plating layer 132 may have a tin (Sn) content of 95 atomic % or more. For example, the second plating layer 132 may have a tin (Sn) content of 98 atomic % or more.

The plating layer according to the embodiment may prevent electrochemical migration resistance due to a diffusion phenomenon of Cu/Sn, and may prevent short-circuit defects due to metal growth.

However, the embodiment is not limited thereto, and the plating layer 130 may include any one of a Ni/Au alloy, gold (Au), electroless nickel immersion gold (ENIG), a Ni/Pd alloy, and organic solderability preservative (OSP).

The first plating layer 131 and the second plating layer 132 may correspond to each other, or have different thicknesses. The total thickness of the first plating layer 131 and the second plating layer 132 may be 0.3 µm to 1 µm. The total thickness of the first plating layer 131 and the second plating layer 132 may be 0.3 µm to 0.7 µm. The total thickness of the first plating layer 131 and the second plating layer 132 may be 0.3 µm to 0.5 µm. Any one plating layer of the first plating layer 131 and the second plating layer 132 may have a thickness of 0.05 µm to 0.15 µm. For example, any one plating layer of the first plating layer 131 and the second plating layer 132 may have a thickness of 0.07 µm to 0.13 µm.

Thereafter, the protective part PP may be screen-printed on the conductive pattern part CP.

The protection layer 140 may be partially disposed on the wiring pattern layer 120. For example, the protection layer 140 may be disposed on the plating layer 130 on the wiring pattern layer 120. Since the protection layer 140 may cover the plating layer 130, it is possible to prevent damage or delamination of a film caused by oxidation of the wiring pattern layer 120 and the plating layer 130.

The protection layer 140 may be partially disposed in a region excluding a region in which the wiring pattern layer 120 and/or the plating layer 130 is electrically connected to a display panel 30, a motherboard 40, a first chip C1, or a second chip C2.

Accordingly, the protection layer 140 may be partially overlapped with the wiring pattern layer 120 and/or the plating layer 130.

An area of the protection layer 140 may be smaller than that of the substrate 110. The protection layer 140 may be disposed in a region excluding an end of the substrate, and may include a plurality of open regions.

The protection layer 140 may include a first open region OA1 having a shape like a hole. The first open region OA1 may be a non-disposing region of the protection layer 140 for electrically connecting the wiring pattern layer 120 and/or the plating layer 130 to the first chip C1.

The protection layer 140 may include a second open region OA2 having a shape like a hole. The second open region OA2 may be a non-disposing region of the protection layer 140 for electrically connecting the wiring pattern layer 120 and/or the plating layer 130 to the second chip C2. Accordingly, the plating layer 130 may be exposed to the outside in the second open region OA2.

In the second open region OA2, a copper content of the plating layer 130 may be 50 atomic % or more. For example, the copper content in the plating layer 130 may be 60 atomic % or more. For example, the copper content in the plating layer 130 may be 60 atomic % to 80 atomic %. Specifically, a copper content of the first plating layer 131 measured in the second open region OA2 may be 60 atomic % to 80 atomic %.

The protection layer 140 may not be disposed on the conductive pattern part for being electrically connected to the main board 40 or the display panel 30. The embodiment may include a third open region OA3 that is a non-disposing region of the protection layer 140 on the conductive pattern part to be electrically connected to the main board 40 or the display panel 30. Accordingly, the plating layer 130 may be exposed to the outside in the third open region OA3.

In the third open region OA3, a copper content of the plating layer 130 may be 50 atomic % or more. Alternatively, in the third open region OA3, a copper content of the plating layer 130 may be less than 50 atomic %. The third open region OA3 may be positioned outside the substrate as compared with the first open region OA1. In addition, the third open region OA3 may be positioned outside the substrate as compared with the second open region OA2.

The first open region OA1 and the second open region OA2 may be positioned in a central region of the substrate as compared with the third open region OA3.

The protection layer 140 may be disposed in a bending region. Accordingly, the protection layer 140 may disperse stress that may occur during bending. Therefore, reliability of the flexible circuit board for all-in-one chip on film according to the embodiment may be improved.

The protection layer 140 may include an insulating material. The protection layer 140 may include various materials that may be heated and cured after being applied to protect the surface of the conductive pattern part. The protection layer 140 may be a resist layer. For example, the protection layer 140 may be a solder resist layer including an organic polymer material. For example, the protection layer 140 may include an epoxy acrylate resin. In detail, the protection layer 140 may include a resin, a curing agent, a photo initiator, a pigment, a solvent, a filler, an additive, an acrylic monomer, and the like. However, the embodiment is not limited thereto, and it is needless to say that the protection layer 140 may be any one of a photo-solder resist layer, a cover-lay, and a polymer material.

The protection layer 140 may have a thickness of 1 μm to 20 μm. The protection layer 140 may have a thickness of 1 μm to 15 μm. For example, the protection layer 140 may have a thickness of 5 μm to 20 μm. When the thickness of the protection layer 140 exceeds 20 μm, the thickness of the flexible circuit board for all-in-one chip on film may increase. When the thickness of the protection layer 140 is less than 1 μm, reliability of the conductive pattern part included in the flexible circuit board for all-in-one chip on film may be lowered.

In other words, a single-side flexible circuit board 100 for all-in-one chip on film according to an embodiment may include a substrate 110, a conductive pattern part CP disposed on one surface of the substrate, dummy pattern parts DP1 and DP2, and a protective part PP formed by partially disposing a protection layer 140 in one region on the dummy pattern parts DP1 and DP2 and the conductive pattern part CP.

The conductive pattern part CP may include the wiring pattern layer 120 and the plating layer 130.

The protective part PP may not be disposed on one region and another region on the conductive pattern part CP.

In addition, the protective part PP may be disposed on the dummy pattern parts DP1 and DP2.

Accordingly, the conductive pattern part CP and the substrate 110 between the separated conductive pattern parts CP may be exposed on the one region and the other region on the conductive pattern part CP. A first connection part 70 and a second connection part 80 may be disposed on the one region and the other region on the conductive pattern part CP, respectively. Specifically, the first connection part 70 and the second connection part 80 may be disposed on an upper surface of the conductive pattern part CP in which the protective part PP is not disposed, respectively.

The first connection part 70 and the second connection part 80 may have different shapes. For example, the first connection part 70 may be a hexahedral shape. Specifically, a cross-section of the first connection part 70 may include a quadrangular shape. In more detail, the cross-section of the first connection part 70 may include a rectangular or square shape. For example, the second connection part 80 may include a spherical shape. A cross-section of the second connection part 80 may include a circular shape. Alternatively, the second connection part 80 may include a partially or wholly rounded shape. As an example, the cross-sectional shape of the second connection part 80 may include a flat surface on one side surface and a curved surface on the other side surface opposite to the one side surface.

The first connection part 70 and the second connection part 80 may have different sizes. The first connection part 70 may be smaller than the second connection part 80.

Widths of the first connection part 70 and the second connection part 80 may be different from each other. For example, a width D1 between both side surfaces of one first connection part 70 may be smaller than a width D2 between both side surfaces of one second connection part 80.

The first chip C1 may be disposed on the first connection part 70. The first connection part 70 may include a conductive material. Accordingly, the first connection part 70 may electrically connect the first chip C1 disposed on an upper surface of the first connection part 70 and the conductive pattern part CP disposed on a lower surface of the first connection part 70.

The second chip C2 may be disposed on the second connection part 80. The second connection part 80 may include a conductive material. Accordingly, the second connection part 80 may electrically connect the second chip C2 disposed on an upper surface of the second connection part 80 and the conductive pattern part CP disposed on a lower surface of the second connection part 80.

Different types of first and second chips C1 and C2 may be disposed on the same one surface of the single-side flexible circuit board 100 for all-in-one chip on film according to the embodiment. Specifically, one first chip C1 and a plurality of second chips C2 may be disposed on the same one surface of the single-side flexible circuit board 100 for all-in-one chip on film according to the embodiment. Accordingly, efficiency of a chip packaging process may be improved.

The first chip C1 may include a drive IC chip.

The second chip C2 may refer to a chip other than a drive IC chip. The second chip C2 may refer to various chips including a socket or an element other than a drive IC chip. For example, the second chip C2 may include at least one of a diode chip, a power supply IC chip, a touch sensor IC chip, a multilayer ceramic capacitor (MLCC) chip, a ball grid array (BGA) chip, and a chip condenser.

The plurality of second chips C2 disposed on the flexible circuit board 100 for all-in-one chip on film may refer to at least one of a diode chip, a power supply IC chip, a touch sensor IC chip, an MLCC chip, a BGA chip, and a chip condenser disposed in plural. As an example, a plurality of MLCC chips may be disposed on the flexible circuit board 100 for all-in-one chip on film.

In addition, the second chip C2 may include at least two of the diode chip, the power supply IC chip, the touch sensor IC chip, the MLCC chip, the BGA chip, and the chip condenser. That is, a plurality of different types of second chips C2A and C2B may be disposed on the flexible circuit board 100 for all-in-one chip on film. For example, the second chip C2A of any one of the diode chip, the power supply IC chip, the touch sensor IC chip, the MLCC chip, the BGA chip, and the chip condenser and one second chip C2B different from the any one of the diode chip, the power supply IC chip, the touch sensor IC chip, the MLCC chip, the BGA chip, and the chip condenser may be included on the flexible circuit board 100 for all-in-one chip on film.

Specifically, the second chip C2A of any one of the diode chip, the power supply IC chip, the touch sensor IC chip, the MLCC chip, the BGA chip, and the chip condenser may be disposed on the flexible circuit board 100 for all-in-one chip on film in plural, and the second chip C2B different from the any one of the diode chip, the power supply IC chip, the touch sensor IC chip, the MLCC chip, the BGA chip, and the chip condenser may be disposed thereon in plural. As an example, a plurality of MLCC chips C2A and a plurality of power supply IC chips C2B may be included on the flexible circuit board 100 for all-in-one chip on film. As an example, the plurality of MLCC chips C2A and a plurality of diode chips C2B may be included on the flexible circuit board 100 for all-in-one chip on film. As an example, the plurality of MLCC chips C2A and a plurality of BGA chips C2B may be included on the flexible circuit board 100 for all-in-one chip on film.

In the embodiment, a type of the second chip is not limited to two, and it is needless to say that all the various chips excluding the drive IC chip may be included in the second chip.

One end of the flexible circuit board 100 for all-in-one chip on film may be connected to a display panel 30. One end of the flexible circuit board 100 for all-in-one chip on film may be connected to the display panel 30 by an adhesive layer 50. Specifically, the display panel 30 may be disposed on an upper surface of the adhesive layer 50, and the flexible circuit board 100 for all-in-one chip on film may be disposed on a lower surface of the adhesive layer 50. Accordingly, the display panel 30 and the flexible circuit board 100 for all-in-one chip on film may be bonded vertically with the adhesive layer 50 interposed therebetween.

The other end opposite to the one end of the flexible circuit board 100 for all-in-one chip on film may be connected to a main board 40. The other end opposite to the one end of the flexible circuit board 100 for all-in-one chip on film may be connected to the main board 40 by an adhesive layer 50. Specifically, the main board 40 may be disposed on the upper surface of the adhesive layer 50, and the flexible circuit board 100 for all-in-one chip on film may be disposed on the lower surface of the adhesive layer 50. Accordingly, the main board 40 and the flexible circuit board 100 for all-in-one chip on film may be bonded vertically with the adhesive layer 50 interposed therebetween.

The adhesive layer 50 may include a conductive material. The adhesive layer 50 may be formed by dispersing conductive particles in an adhesive material. For example, the adhesive layer 50 may be an anisotropic conductive film (ACF).

Accordingly, the adhesive layer 50 may transmit electrical signals between the display panel 30, the flexible circuit board 100 for all-in-one chip on film, and the main board 40, and may stably connect other components.

Meanwhile, the dummy pattern parts DP1 and DP2 as described above are disposed on the substrate 110. That is, the upper dummy pattern part DP2 is disposed on the upper surface of the substrate 110, and the lower dummy pattern part DP1 is disposed on the lower surface of the substrate 110.

The upper dummy pattern part DP2 may be disposed in a region of the upper surface of the substrate 110, in which the upper wiring pattern layer is not disposed. Preferably, the upper dummy pattern part DP2 may be disposed in a region of the upper surface of the substrate overlapped vertically with the lower wiring pattern layer disposed at the lower surface of the substrate 110, in which the upper wiring pattern layer is not disposed.

The lower dummy pattern part DP1 may be disposed in a region of the lower surface of the substrate 110, in which the lower wiring pattern layer is not disposed. Preferably, the lower dummy pattern part DP1 may be disposed in a region of the lower surface of the substrate overlapped vertically with the upper wiring pattern layer disposed at the upper surface of the substrate 110, in which the upper wiring pattern layer is not disposed.

That is, positions of the upper wiring pattern layer and the lower wiring pattern layer disposed on the substrate 110 do not correspond to each other, and are designed according to a function of each and the number of signal wiring lines, and are disposed on each surface of the substrate 110.

Therefore, the lower wiring pattern layer and the lower plating layer may not be disposed at the lower surface of the substrate 110 overlapped vertically with the region in which the upper wiring pattern layer and the upper plating layer are disposed. In addition, the upper wiring pattern layer and the upper plating layer may not be disposed at the upper surface of the substrate 110 overlapped vertically with a region in which the lower wiring pattern layer and the lower plating layer are disposed.

At this time, the protection layer 140 is disposed on the substrate 110 by a printing process. The protection layer 140 is preferentially printed on one surface of the substrate 110, and after the printing process on the one surface is completed, a printing process of the other surface of the substrate 110 is performed.

Here, in a surface on which the protection layer 140 is printed first of the one surface and the other surface of the substrate, a region in which a wiring pattern layer/a plating layer is not disposed and a region in which the wiring pattern layer/the plating layer is disposed coexist at an opposite surface thereof, and thus a step occurs. At this time, when the step is present on a surface opposite to a surface on which the protection layer 140 is printed, a problem that the protection layer 140 is not disposed in the printing process of the protection layer 140 or a problem of pin-holes may occur, which will greatly affect the reliability of the printed circuit board.

Therefore, in the present invention, in order to solve the above problems, the dummy pattern parts DP1 and DP2 are formed on the opposite surface of the surface on which the protection layer 140 is printed so that the step does not exist.

At this time, when the printing process of the protection layer 140 is preferentially performed on the upper surface of both surfaces of the substrate 110, the dummy pattern parts DP1 and DP2 may include only the lower dummy pattern part DP1. That is, when the protection layer 140 is printed at the upper surface of the substrate 110, a pattern step is solved by the lower dummy pattern part DP1 disposed on the lower surface of the substrate 110, and accordingly, the protection layer 140 having a uniform height may be disposed on the upper surface of the substrate 110.

Then, when the printing process of the protection layer 140 for the lower surface of the substrate 110 is performed after the printing process of the protection layer 140 for the upper surface of the substrate 110 is completed, a step between the protection layer 140 formed on the upper surface of the substrate 110 and the upper wiring pattern layer/the upper plating layer is solved, and accordingly, a uniform protection layer 140 may be formed at the lower surface of the substrate 110.

However, of the one surface and the other surface of the substrate 110, the surface on which the protection layer 140 is printed first, frequently changes according to a manufacturing environment of the printed circuit board. Therefore, in the present invention, considering the manufacturing environment of the printed circuit board as described above, the upper dummy pattern part DP2 is formed at a position corresponding to the lower wiring pattern layer and the lower plating layer of the upper surface of the substrate 110, and the lower dummy pattern part DP1 is formed at a position corresponding to the upper wiring pattern layer and the upper plating layer of the lower surface of the substrate 110. Here, the corresponding position refers to a position on the other surface of the substrate overlapped vertically with the wiring pattern layer and the plating layer disposed on one surface of the substrate 110.

The dummy pattern parts DP1 and DP2 may be formed of a single layer. Preferably, the dummy pattern parts DP1 and DP2 may include only a dummy pattern layer. The dummy pattern layer may include the same metal material as that of the wiring pattern layer. However, the present invention is not limited thereto, and the dummy pattern layer may include a different material from that of the wiring pattern layer. For example, the dummy pattern layer may include a non-metallic material.

In addition, alternatively, as shown in FIG. 3B, the dummy pattern parts DP1 and DP2 may include a first dummy pattern layer 151, a second dummy pattern layer 152, and a third dummy pattern layer 153.

The first dummy pattern layer 151 corresponds to the wiring pattern layer 120. The first dummy pattern layer 151 includes the same metal material as that of the wiring pattern layer 120. The first dummy pattern layer 151 may be a part of the wiring pattern layer 120. In other words, the wiring pattern layer 120 electrically connected to a chip and transmitting signals is disposed at the surface of the substrate 110. In this case, the first dummy pattern layer 151 may be formed together with the wiring pattern layer 120. That is, a pattern layer is formed on the substrate 110, which includes the wiring pattern layer 120 for transmitting an electrical signal and the first dummy pattern layer 151. The first dummy pattern layer 151 does not transmit an electrical signal unlike the wiring pattern layer 120, and accordingly, is not electrically connected to the wiring pattern layer 120. That is, the first dummy pattern layer 151 may not be connected to the wiring pattern layer 120, and may be independently disposed on a region in which the wiring pattern layer 120 is not disposed of the surface of the substrate 110.

The second dummy pattern layer 152 is disposed on the first dummy pattern layer 151. The second dummy pattern layer 152 may be a part of the first plating layer 131. The third dummy pattern layer 152 is disposed on the second dummy pattern layer 152. The third dummy pattern layer 153 may be a part of the second plating layer 132.

In other words, the dummy pattern parts DP1 and DP2 in the present invention may be formed as a single layer, unlike a layer structure of the conductive pattern part CP. In addition, the dummy pattern parts DP1 and DP2 may be formed of three layers, like the layer structure of the conductive pattern part CP.

Meanwhile, the protection layer 140 is disposed on the dummy pattern parts DP1 and DP2. That is, the protection layer 140 exposes a part of a surface of the conductive pattern part CP to be opened. In addition, the dummy pattern parts DP1 and DP2 need not be exposed to the outside, and accordingly, the protection layer 140 is disposed on the dummy pattern parts DP1 and DP2.

Meanwhile, referring to FIG. 3A, the area of the wiring pattern layer 120 may correspond to the plating layer 130. The area of the first plating layer 131 may correspond to the area of the second plating layer 132.

Referring to FIG. 7, the area of the wiring pattern layer 120 may be different from that of the plating layer 130. The area of the wiring pattern layer 120 may correspond to the area of the first plating layer 131. The area of the first plating layer 131 may be different from that of the second plating layer 132. For example, the area of the first plating layer 131 may be larger than that of the second plating layer 132.

Referring to FIG. 8, the area of the wiring pattern layer 120 may be different from that of the plating layer 130.

Referring to FIG. 9, the area of the wiring pattern layer 120 on one surface of the substrate 110 is different from that of the plating layer 130, and the area of the wiring pattern layer 120 on the other surface of the substrate 110 may correspond to the area of the plating layer. 130.

The protection layer 140 may be disposed on the substrate 110 in direct contact, disposed on the wiring pattern layer 120 in direct contact, or disposed on the first plating layer 131 in direct contact. or disposed on the second plating layer 132 in direct contact. In addition, the protection layer 140 may be disposed in direct contact with the dummy pattern parts DP1 and DP2.

Referring to FIGS. 3A and 3B, the first plating layer 131 may be disposed on the wiring pattern layer 120, the second plating layer 132 may be formed on the first plating layer 131, and the protection layer 140 may be partially disposed on the second plating layer 132. In addition, the protection layer 140 may be entirely disposed on the dummy pattern parts DP1 and DP2.

Referring to FIGS. 7A and 7B, the first plating layer 131 may be disposed on the wiring pattern layer 120, and the protection layer 140 may be partially disposed on the first plating layer 131. The second plating layer 132 may be disposed in a region other than a region in which the protection layer 140 is disposed on the plating layer 131.

The first plating layer 131 in contact with a lower surface of the protection layer 140 may be an alloy layer of copper and tin. The second plating layer 132 contacting a side surface of the protection layer 140 may include pure tin. Accordingly, formation of a cavity part between the protection layer 140 and the first plating layer 131 may prevent the protection layer from being removed and prevent formation of whiskers, thereby increasing adhesion of the protection layer. Therefore, the embodiment may include two layers of plating layers, and thus an electronic device with high reliability may be provided.

In addition, when only the single-layered tin plating layer 131 is disposed on the wiring pattern layer 120, and when the protection layer 140 is disposed on one tin plating layer 131, the tin plating layer 131 is heated when the protection layer 140 is thermally cured, and thus copper may diffuse into the tin plating layer 131. Accordingly, since the tin plating layer 131 may be an alloy layer of tin and copper, there is a problem that the first chip having a gold bump may be not firmly mounted. Therefore, the plating layer 130 according to the embodiment requires the first plating layer 131 and the second plating layer 132 that may continuously increase a tin concentration as a distance from the substrate increases.

In addition, as shown in FIG. 7A, the dummy pattern parts DP1 and DP2 may include a single dummy pattern layer corresponding to the wiring pattern layer 120 and the first plating layer 131.

Further, as shown in FIG. 7B, the dummy pattern parts DP1 and DP2 may include a first dummy pattern layer 151 corresponding to the wiring pattern layer 120, a second dummy pattern layer 152 corresponding to the first plating layer 131, and a third dummy pattern layer 153 corresponding to the second plating layer 132.

Referring to FIG. 8, the first plating layer 131 may be disposed on the wiring pattern layer 120, and the protection layer 140 may be partially disposed on the first plating layer 131. The second plating layer 132 may be disposed in a region other than the region in which the protection layer 140 is disposed on the plating layer 131.

At this time, the wiring pattern layer 120 may include a first wiring pattern layer 121 and a second wiring pattern layer 122. That is, a plurality of wiring pattern layers may be disposed on the substrate.

In addition, although not shown in drawings, a metal seed layer for improving adhesion between the substrate 110 and the first wiring pattern layer 121 may be further included between the substrate 110 and the first wiring pattern layer 121. At this time, the metal seed layer may be formed by sputtering. The metal seed layer may include copper.

The first wiring pattern layer 121 and the second wiring pattern layer 122 may correspond to each other, or may be formed in different processes.

The first wiring pattern layer 121 may be formed by sputtering copper in a thickness of 0.1 μm to 0.5 μm. The first wiring pattern layer 121 may be disposed at upper and lower portions of the substrate and an inner side surface of the through-hole. At this time, since the first wiring pattern layer 121 is thin, the inner side surface of the through-hole may be spaced apart from each other.

Next, the second wiring pattern layer 122 may be disposed on the first wiring pattern layer 121. In addition, the second wiring pattern layer 122 may be entirely filled in the through-hole by plating.

Since the first wiring pattern layer 121 is formed by sputtering, the first wiring pattern layer 121 has an advantage of excellent adhesion to the substrate 110 or the metal seed layer, but a manufacturing cost is high, and thus the manufacturing cost may be reduced by forming again the second wiring pattern layer 122 on the first wiring pattern layer 121 by plating. In addition, the second wiring pattern layer 122 may be disposed on the first wiring pattern layer 121 and at the same time, the via hole may be filled with copper without separately filling the through-hole of the substrate with a conductive material, thereby improving process efficiency. Further, since it is possible to prevent voids from being formed in the via hole, a highly reliable flexible circuit board for all-in-one chip on film and an electronic device including the same may be provided.

In addition, dummy pattern parts DP1 and DP2 may include a first dummy pattern layer 151 corresponding to the first wiring pattern layer 121, a second dummy pattern layer 152 corresponding to the second wiring pattern layer 122, a third dummy pattern layer 153 corresponding to the first plating layer 131, and a fourth dummy pattern layer 154 corresponding to the second plating layer 132.

Referring to FIG. 9, a plurality of protection layers 140 may be disposed on one surface of the substrate. The protection layer may include a first protection layer 141 and a second protection layer 142.

For example, the first protection layer 141 may be partially disposed on one surface of the substrate, and the wiring pattern layer 120 may be disposed on a region other than the region in which the protection layer 141 is disposed.

The second protection layer 142 may be disposed on the protection layer 141. The second protection layer 142 may cover the first protection layer 141 and the wiring pattern layer 120, and may be disposed in a larger region than the first protection layer 141.

The protection layer 142 may be disposed on a region corresponding to the protection layer 141 while surrounding an upper surface of the first protection layer 141. A width of the second protection layer 142 may be larger than that of the protection layer 141. Accordingly, a lower surface of the second protection layer 142 may be in contact with the wiring pattern layer 120 and the first protection layer 141. Accordingly, the second protection layer 142 may relieve stress concentration at an interface between the first protection layer 141 and the wiring pattern layer 120. Therefore, when bending the flexible circuit board for all-in-one chip on film according to the embodiment, it is possible to reduce an occurrence of removal of a film or cracks.

The plating layer 130 may be disposed in a region other than the region in which the second protection layer 142 is disposed. Specifically, the first plating layer 131 may be disposed on the wiring pattern layer 120 in a region other than the region in which the second protection layer 142 is disposed, and the second plating layer 132 may be disposed on the first plating layer 131 in order.

The wiring pattern layer 120 may be disposed on the other surface opposite to the one surface of the substrate. The plating layer 130 may be disposed on the wiring pattern layer 120. The protection layer 140 may be partially disposed on the plating layer 130.

Widths of the protection layer disposed on one surface of the substrate and the protection layer disposed on the other surface of the substrate may correspond to each other or may be different from each other.

In the drawing, it is shown that a plurality of protection layers are disposed only on one surface of the substrate, but the embodiment is not limited thereto, and it is needless to say that the plurality of protection layers may be included on both surfaces of the substrate. In addition, it is needless to say that a plurality of or one protection layer may be disposed only on one surface of the substrate.

In addition, it is needless to say that a structure of one surface or both surfaces of the substrate may be variously disposed by combining structures of the conductive pattern part and the protective part according to at least one of FIGS. 3A, 3B, 7A, 7B, 8 and 9.

Referring to FIGS. 4A and 4B, in a flexible circuit board according to a comparative example, an upper conductive pattern part CP is disposed on an upper surface of a substrate 110, and a lower conductive pattern part CP is disposed on a lower surface of the substrate 110. At this time, the upper conductive pattern part CP and the lower conductive pattern part CP are designed without considering a printing process of a protection layer 140. Therefore, the upper conductive pattern part CP may be present on the upper surface of the substrate 110, but a region in which the lower conductive pattern part CP does not exist may be included at the lower surface of the substrate 110. In other words, a region in which the lower conductive pattern part CP is not disposed is present on the lower surface of the substrate 110 overlapped vertically with a surface on which the upper conductive pattern part CP is disposed.

In this case, in the flexible circuit board according to the comparative example, the lowermost surface becomes the lower surface of the lower conductive pattern part CP in the region in which the lower conductive pattern part CP exists, and the lowermost surface becomes the lower surface of the substrate 110 in the region in which the lower conductive pattern part CP does not exist.

In addition, in a process of printing the protection layer 140 on the upper surface of the substrate 110, the lowermost surface is the same as the lower surface of the substrate 110 in the region overlapped vertically with the region in which the lower conductive pattern part CP is not disposed, and accordingly, a pinhole phenomenon does not occur. In this case, in a state of printing the protection layer 140 in the region in which the lower conductive pattern part CP does not exist, when the lower conductive pattern part CP suddenly appears, a spattering phenomenon occurs due to a sudden occurrence of a step in an upper region of the substrate 110 overlapped vertically with an end of the lower conductive pattern part CP. Accordingly, in the related art, the spattering phenomenon occurs in an end region in which the lower dummy pattern part DP1 is first disposed, and accordingly, a pinhole problem in which the protection layer 140 is not disposed occurs.

Meanwhile, as shown in FIG. 4B, in the present invention, the lower dummy pattern part DP1 is disposed at the lower surface of the substrate 110 overlapped vertically with the region in which the upper conductive pattern part CP is disposed, and thus the occurrence of the step may be eliminated, and accordingly, a uniform protection layer 140 may be formed.

In addition, the lower dummy pattern part DP1 may be disposed to correspond to each of the upper conductive pattern parts CP. In other words, as shown in FIG. 4B, it may be confirmed that three upper conductive pattern parts CP are disposed on the upper surface of the substrate 110 overlapped vertically with the region in which the lower conductive pattern part CP is not disposed. Accordingly, a first lower dummy pattern part DP1, a second lower dummy pattern part DP1, and a third lower dummy pattern part DP1 may be disposed respectively at the lower surface of the substrate 110 to correspond to each of the three upper conductive pattern parts CP.

Meanwhile, the pinhole phenomenon of the protection layer 140 as described above is because a position at which a first upper conductive pattern part CP on the upper surface of the substrate 110 on which the protection layer 140 is printed is started and a position at which a first lower conductive pattern part CP on the lower surface of the substrate is started are different from each other. Preferably, the position at which the lower conductive pattern part CP is started is farther than the position at which the first upper conductive pattern part CP is started based on a left end of the substrate.

Therefore, the pinhole phenomenon may be solved by setting the position at which the first upper conductive pattern part CP is started to be the same as the position at which the lower conductive pattern part CP is started.

That is, as shown in FIG. 5A, when the region A of FIG. 3A is enlarged, it may be confirmed that four upper conductive pattern parts CP are disposed on the upper surface of the substrate 110 with respect to the left end. In addition, it may be confirmed that two lower conductive pattern parts CP are disposed on the lower surface of the substrate 110 with respect to the left end. That is, it may be confirmed that the lower conductive pattern part CP is started initially at the position of the upper conductive pattern part CP positioned third of the four upper conductive pattern parts CP.

Therefore, in the present invention, the lower dummy pattern part DP1 is disposed on a region overlapped vertically with the first upper conductive pattern part CP of the lower surface of the substrate 110. At this time, the left end of the first upper conductive pattern part and the left end of the lower dummy pattern part DP1 may be positioned on the same vertical line. That is, a starting position of the first upper conductive pattern part CP and a starting position of the lower dummy pattern part DP1 are set the same on the upper and lower surfaces of the substrate 110. In addition, the lower conductive pattern part CP or the lower dummy pattern part DP1 may not be disposed on a region overlapped vertically with the second upper conductive pattern part CP.

That is, when the lower conductive pattern part CP is not disposed on the lower surface of the substrate 110 overlapped with the starting position of the first upper conductive pattern part CP, the lower dummy pattern part DP1 may be disposed only on the lower surface of the substrate 110 overlapped with the starting position of the first upper conductive pattern part CP to solve the pinhole phenomenon.

However, in order to completely solve the pinhole phenomenon using the one lower dummy pattern part DP1, it is preferable that a width of the lower dummy pattern part DP1 is set larger than that of the first upper conductive pattern part CP.

Alternatively, as shown in FIG. 5B, the lower dummy pattern part DP1 is disposed on the region overlapped vertically with the first upper conductive pattern part CP of the lower surface of the substrate 110. At this time, the left end of the first upper conductive pattern part and the left end of the lower dummy pattern part DP1 may not be positioned on the same vertical line. That is, the starting position of the first upper conductive pattern part CP and the starting position of the lower dummy pattern part DP1 may not be the same on the upper and lower surfaces of the substrate 110. At this time, under the above conditions, in order to solve the pinhole phenomenon, a starting position of a pattern initially disposed on the opposite surface of the surface to be printed should be faster than a starting position of a pattern initially disposed on the surface on which the protection layer 140 is printed (including the conductive pattern part CP and the dummy pattern parts DP1 and DP2).

Therefore, in the present invention, the lower dummy pattern part DP1 is formed on the lower surface of the substrate 110 overlapped vertically with the first upper conductive pattern part CP such that the starting position of the lower dummy pattern part DP1 disposed on the lower surface of the substrate 110 is faster than the starting position of the first upper conductive pattern part CP.

In other words, a distance from the left end of the substrate 110 to the left end of the lower dummy pattern part DP1 is set closer than a distance from the left end of the substrate 110 to the left end of the first upper conductive pattern part CP.

In conclusion, there may be a difference of about a first pitch a from the left end of the first upper conductive pattern part CP to the left end of the lower dummy pattern part DP1. In addition, the width of the first upper conductive pattern part CP has a first width b, and the width of the lower dummy pattern part DP1 is set to have a second width c wider than the first width b.

Accordingly, in the present invention, the pinhole phenomenon may be solved by forming a minimum number of dummy pattern parts.

In addition, as shown in FIG. 5C, the lower dummy pattern part DP1 may have a third width d. At this time, the third width d may correspond to the total width of a width of the first upper conductive pattern part CP, a width of the second upper conductive pattern part CP, and a spacing width between the first upper conductive pattern part CP and the second upper conductive pattern part CP.

In other words, in FIG. 4B, the first lower dummy pattern part DP1 having the same width as the first upper conductive pattern part CP was formed under the first upper conductive pattern part CP, and the second lower dummy pattern part DP1 having the same width as the second upper conductive pattern part CP was formed under the second upper conductive pattern part CP.

Alternatively, as shown in FIG. 5C, only one conductive pattern part CP may be formed on the lower surface of the substrate 110 corresponding to an end position of the second upper conductive pattern part CP from the starting position of the first upper conductive pattern part CP.

Meanwhile, the dummy pattern parts DP1 and DP2 in the present invention may have various shapes. That is, since the dummy pattern parts DP1 and DP2 are disposed to eliminate a step at a lower portion of the printed surface of the protection layer 140, a thickness of the pattern part should be maintained to be the same as that of the conductive pattern part CP. Accordingly, the dummy pattern parts DP1 and DP2 may have a bar shape extending horizontally as shown in (a) of FIG. 5D, may have a bar shape extending vertically as shown in (b), may have a circular shape as shown in (c), may have a circular shape (ring shape) with an open center as shown in (d), and may have a quadrangular shape (ladder shape) with an open center as shown in (e). In addition, the shape of the dummy pattern parts DP1 and DP2 in the present invention is not limited thereto, and may be modified into various shapes such as an elliptical shape, a fan shape, a polygonal shape, and a triangular shape.

In addition, as shown in FIG. 6, when region B of FIG. 3A is enlarged, the upper dummy pattern part DP2 is disposed on the upper surface of the substrate 110. A position and condition of forming the upper dummy pattern part DP2 are the same as position and condition of forming the lower dummy pattern part DP1. That is, when the starting position of the upper conductive pattern part CP is later than the starting position of the lower conductive pattern part CP initially positioned, with respect to a right end of the substrate 110, the upper dummy pattern part DP2 is formed on the upper surface of the substrate 110 overlapped vertically with the starting position of the lower conductive pattern part CP positioned initially. At this time, the upper dummy pattern part DP2 may be disposed in plural to correspond to the respective lower conductive pattern part CP, and alternatively, the upper dummy pattern part DP2 may be formed in a single part only to correspond to the lower conductive pattern part CP started initially.

Referring to FIGS. 3A, 3B, 7A, 7B, 8, 10, and 11, connection relationship of the first chip C1, the display panel 30, and the main board 40 mounted on the double-side flexible circuit board 100 for all-in-one chip on film will be described.

The double-side flexible circuit board 100 for all-in-one chip on film according to the embodiment may include: a substrate 100 including a through-hole; a wiring pattern layer 120 disposed on both surfaces of the substrate including the through-hole; a first plating layer 131 disposed on the wiring pattern layer 120; a second plating layer 132 disposed on the first plating layer 131; and a protection layer 140 partially disposed on the wiring pattern layer.

A disposing region of the protection layer 400 in which the protection layer 140 is formed may be the protective part PP. The conductive pattern part CP may be exposed to the outside in a region other than the protective portion PP in which the protection layer 140 is not formed. That is, the conductive pattern part CP may be electrically connected to the first chip C1, the display panel 30, and the main board 40 in an open region of the protection layer or a region in which the protective part is not disposed on the conductive pattern part.

A lead pattern part and a test pattern part of the flexible circuit board for all-in-one chip on film according to the embodiment may not overlap with the protective part. That is, the lead pattern part and the test pattern part may refer to a conductive pattern part positioned in an open region that is not covered by a protection layer, and may be distinguished into a lead pattern part and a test pattern part according to functions.

The lead pattern part may refer to a conductive pattern part to be connected to the first chip, the second chip, the display panel, or the main board.

The test pattern part may refer to a conductive pattern part for checking whether the flexible circuit board for all-in-one chip on film according to the embodiment and a product of a chip package including the same is defective.

The lead pattern part may be distinguished into an inner lead pattern part and an outer lead pattern part depending on a location. One region of a conductive pattern part that is relatively close to the first chip C1 and is not overlapped by a protection layer may be represented as the inner lead pattern part. One region of a conductive pattern part that is positioned relatively far from the first chip C1 and is not overlapped by a protection layer may be represented as the outer lead pattern part.

Referring to FIGS. 3A, 3B, 7A, 7B, 8, 10, and 11, a flexible circuit board 100 for all-in-one chip on film according to the embodiment may include a first inner lead pattern part I1, a second inner lead pattern part I2, a third inner lead pattern part I3, and a fourth inner lead pattern part I4.

The flexible circuit board 100 for all-in-one chip on film according to the embodiment may include a first outer lead pattern part O1, a second outer lead pattern part O2, a third outer lead pattern part O3, and a fourth outer lead pattern part O4.

The flexible circuit board 100 for all-in-one chip on film according to the embodiment may include a first test pattern part T1 and a second test pattern part T2.

The first inner lead pattern part I1, the second inner lead pattern part I2, the third inner lead pattern part I3, the first outer lead pattern part O1, and the second outer lead pattern part O2 may be disposed on one surface of the flexible circuit board 100 for all-in-one chip on film according to the embodiment.

The fourth inner lead pattern part I4, the third outer lead pattern part O3, the fourth outer lead pattern part O4, the first test pattern part T1, and the second test pattern part T2 may be included on the other surface opposite to the one surface of the flexible circuit board 100 for all-in-one chip on film according to the embodiment The first chip C1 disposed on one surface of the flexible circuit board 100 for all-in-one chip on film according to the embodiment may be connected to the first inner lead pattern part I1, the second inner lead pattern part I2, or the third inner lead pattern part I3 via a first connection part 70.

The first connection part 70 may include a first sub second connecting part 71, a second sub first connection part 72, and a third sub first connection part 73 depending on the location and/or function.

The first chip C1 disposed on one surface of the flexible circuit board 100 for all-in-one chip on film according to the embodiment may be electrically connected to the first inner lead pattern part I1 via the first sub first connection part 71.

The first inner lead pattern part I1 may transmit an electrical signal to the first outer lead pattern part O1 adjacent to a second via hole V2 along the upper surface of the substrate 110. The second via hole V2 and the first outer lead pattern part O1 may be electrically connected to each other. That is, the first inner lead pattern part I1 and the first outer lead pattern part O1 may be one end and the other end of the conductive pattern part extending in one direction.

For example, the main board 40 may be connected to the first outer lead pattern part O1 via an adhesive layer 50. Accordingly, a signal transmitted from the first chip may be transmitted to the main board 40 via the first inner lead pattern part I1 and the first outer lead pattern part O1

In addition, the first inner lead pattern part I1 may be electrically connected to the second via hole V2 along the upper surface of the substrate 110, and an electrical signal may be transmitted to the third outer lead pattern part O3 adjacent to the second via hole V2 along the lower surface of the substrate 110 through the conductive material filled in the second via hole V2. The second via hole V2 may be electrically connected to the third outer lead pattern part O3. Accordingly, although not shown in the drawing, the main board 40 may be electrically connected to the third outer lead pattern part O3 via the adhesive layer 50.

The first chip C1 disposed on one surface of the flexible circuit board 100 for all-in-one chip on film according to the embodiment may be electrically connected to the second inner lead pattern part I2 via the second sub first connection part 72.

The second inner lead pattern part I2 disposed on the upper surface of the substrate 110 may transmit an electrical signal to the fourth inner lead pattern part I4 and the first test pattern part T1 adjacent to a first via hole V1 along the lower surface of the substrate 110 through a conductive material filled in the first via hole V1 positioned under the second inner lead pattern part I2. The first via hole V1, the first test pattern part T1, and the fourth inner lead pattern part I4 may be electrically connected on the lower surface of the substrate.

The display panel 30 may be attached to the fourth inner lead pattern part I4 and the fourth outer lead pattern part O4.

The first test pattern part T1 may confirm a failure of an electrical signal that may be transmitted through the first via hole V1. For example, accuracy of a signal transmitted to the fourth inner lead pattern part I4 may be confirmed via the first test pattern part T1. In detail, by measuring a voltage or a current in the first test pattern part T1, it may be possible to confirm whether a short circuit or a short occurs or a generated location of the short circuit or short in the conductive pattern part positioned between the first chip and the display panel, thereby improving reliability of a product.

The first chip C1 disposed on one surface of the flexible circuit board 100 for all-in-one chip on film according to the embodiment may be electrically connected to the third inner lead pattern part I3 via the third sub first connection part 73.

The third inner lead pattern part I3 may transmit an electrical signal to the second outer lead pattern part O2 adjacent to a third via hole V3 along the upper surface of the substrate 110. The third via hole V3 and the second outer lead pattern part O2 may be electrically connected. That is, the third inner lead pattern part I3 and the second outer lead pattern part O2 may be one end and the other end of the conductive pattern part extending in one direction.

In addition, the third inner lead pattern part I3 may be electrically connected to the third via hole V3 along the upper surface of the substrate 110, and an electrical signal may be transmitted to the fourth outer lead pattern part O4 and the second test pattern part T2 adjacent to the third via hole V3 along the lower surface of the substrate 110 through the conductive material filled in the third via hole V3.

The second via hole V2, the fourth outer lead pattern part O4, and the second test pattern part T2 may be electrically connected at the lower surface of the substrate.

As described above, the display panel 30 may be attached to the fourth inner lead pattern part I4 and the fourth outer lead pattern part O4 through the adhesive layer 50.

The second test pattern part T2 may confirm a failure of an electrical signal that may be transmitted via the third via hole V3. For example, accuracy of a signal transmitted to the fourth outer lead pattern part O4 may be confirmed via the second test pattern part T2. In detail, by measuring a voltage or a current in the second test pattern part T2, it may be possible to confirm whether a short circuit or a short occurs or a generated location of the short circuit or short in the conductive pattern part positioned between the first chip and the display panel, thereby improving reliability of a product.

The flexible circuit board for all-in-one chip on film according to the embodiment may dispose the display panel 30 on the other surface opposite to one surface on which the first chip C1 is disposed, thereby improving the degree of freedom of design. Further, the display panel is disposed on the other surface opposite to the one surface on which a plurality of chips are mounted, and thus it is possible to dissipate heat effectively. Accordingly, reliability of the flexible circuit board for all-in-one chip-on-film according to embodiment may be improved.

FIG. 10 is a plan view of FIG. 7A, and FIG. 11 is a bottom view of FIG. 7A.

Referring to FIGS. 10 and 11, the flexible circuit board 100 for all-in-one chip on film of the embodiment may include sprocket holes on both outsides in the longitudinal direction for convenience of manufacturing or processing. Accordingly, the flexible circuit board 100 for all-in-one chip on film of the embodiment may be rolled or unwound by sprocket holes in a roll-to-roll method.

The flexible circuit board 100 for all-in-one chip on film of the embodiment may be defined as an inner region IR and an outer region OR based on a cut portion indicated by a dotted line.

The conductive pattern part for connecting respectively the first chip, the second chip, the display panel, and the main board may be disposed in the inner region IR of the flexible circuit board 100 for all-in-one chip on film.

A chip package including the flexible circuit board 100 for all-in-one chip on film and an electronic device including the same may be processed by cutting a portion in which a sprocket hole is formed on the flexible circuit board 100 for all-in-one chip on film and disposing a chip on a substrate.

Referring to FIG. 11, on the upper surface of the flexible circuit board 100 for all-in-one chip on film, the first inner lead pattern part I1, the second inner lead pattern part I2, and the third inner lead pattern part I3 which are one region of a conductive pattern part CP may be exposed to the outside via a first open region OA1 of the protection layer 140.

In addition, on the upper surface of the flexible circuit board 100 for all-in-one chip on film, the first outer lead pattern part O1 which is one region of the conductive pattern part CP may be exposed to the outside via a third open region OA3 of the protection layer 140.

The first inner lead pattern part I1 and the third inner lead pattern part I3 may be a conductive pattern part connected to a chip via a first connection part.

End portions of the first inner lead pattern part I1 and the third inner lead pattern part I3 may be disposed in the same row. For example, a plurality of the first inner lead pattern part I1 may be spaced apart from each other in a horizontal direction (x-axis direction) of a substrate, and the end portions of the first inner lead pattern part I1 may be disposed in the same row. For example, a plurality of the third inner lead pattern part I3 may be spaced apart from each other in a horizontal direction (x-axis direction) of the substrate, and the end portions of the third inner lead pattern part I3 may be disposed in the same row. Accordingly, the first inner lead pattern part I1 and the third inner lead pattern part I3 may be excellent in bonding with the first connection part and the first chip.

A plurality of the second via holes V2 may be spaced apart from each other in a horizontal direction (x-axis direction) of the substrate, and may be disposed in the same row. A plurality of the third via holes V3 may be spaced apart from each other in a horizontal direction (x-axis direction) of the substrate, and may be disposed in the same row.

The end portion of the first inner lead pattern part I1 may be spaced apart from an end portion of a second inner lead pattern part I2.

The second inner lead pattern part I2 may be a conductive pattern that is not bonded to the first chip. At least one end portion of one end and the other end of the second inner lead pattern part I2 may not be disposed in the same row.

For example, a plurality of the second inner lead pattern part I2 may be spaced from each other in a horizontal direction (x-axis direction) of the substrate. In addition, a separation distance between at least one end portion of the one end and the other end of the second inner lead pattern part I2 and the end of the first inner lead pattern part I1 may decrease as closer to the horizontal direction (x-axis direction) of the substrate. A separation distance between at least one end of the one end and the other end of the second inner lead pattern part I2 and the end of the first inner lead pattern part I1 may increase as closer to the horizontal direction (x-axis direction) of the substrate.

A plurality of the first via holes V1 may be spaced apart from each other and disposed in different rows in a horizontal direction (x-axis direction) of the substrate.

A length between one end and the other end of the second inner lead pattern part I2 is gradually decreased as closer to the horizontal direction (x-axis direction) of the substrate, and thus a first set part of the second inner lead pattern parts I2 may be included. In detail, the length between the one end and the other end of the second inner lead pattern part I2 is gradually decreased as closer to the horizontal direction (x-axis direction) of the substrate from a first length to a second length, and thus the first set part of the second inner lead pattern parts I2 having a second length may be included. At this time, the first length may be greater than the second length. A plurality of first sets may be disposed on the substrate. Therefore, the second inner lead pattern part I2 having a length that is gradually decreased from the first length to the second length may be included on the substrate 110. The second inner lead pattern part I2 adjacent to the second inner lead pattern part I2 having the second length may have the first length again. Accordingly, the first set part of the second inner lead pattern parts I2 of which length is gradually decreased from the first length to the second length as closer to the horizontal (x-axis direction) of the substrate and the first set part of the second inner lead pattern parts I2 of which length is gradually decreased from the first length to the second length may be repeatedly disposed.

The separation distance between at least one end portion of the one end and the other end of the second inner lead pattern part I2 and the end portion of the first inner lead pattern part I1 may decrease as closer to the horizontal direction (x-axis direction) of the substrate.

A plurality of the first inner lead pattern part I1 may be spaced apart from each other by a first distance. One end portion of the second inner lead pattern part I2 may be positioned in a region between two adjacent first inner lead pattern parts I1 which are spaced apart from each other.

In the horizontal direction of the substrate, the end portion of the first inner lead pattern part I1 and the end portion of the second inner lead pattern part I2 may be alternately disposed.

Referring to FIG. 11, on the lower surface of the flexible circuit board 100 for all-in-one chip on film, the fourth inner lead pattern part I4 and the fourth outer lead pattern part O4 which are one region of the conductive pattern part CP may be exposed to the outside via the third open region OA3 of the protection layer 140.

Referring to FIG. 7B and FIGS. 12 to 16, a chip package including a first chip C1 and a second chip C2 on a double-side flexible circuit board 100 all-in-one chip on film according to an embodiment will be described in detail.

FIG. 12 is a schematic plan view of a chip package including a double-side flexible circuit board 100 for all-in-one chip on film according to an embodiment.

With reference to FIGS. 12A and 12B, the double-side flexible circuit board 100 for all-in-one chip on film according to the embodiment may include the first chip C1 and the second chip C2 disposed on the same one surface.

In the double-side flexible circuit board 100 for all-in-one chip on film according to the embodiment, a length in a horizontal direction (x-axis direction) may be larger than a length in a vertical direction (y-axis direction). That is, the double-side flexible circuit board 100 for all-in-one chip on film according to the embodiment may include two long sides in the horizontal direction and two short sides in the vertical direction.

Each of the first chip C1 and the second chip C2 may have the length in the horizontal direction (x-axis direction) larger than the length in the vertical direction (y-axis direction). That is, the first chip C1 and the second chip C2 may include two long sides in the horizontal direction and two short sides in the vertical direction.

The long side of the double-side flexible circuit board 100 for all-in-one chip on film according to the embodiment may be disposed in parallel with the long side of the first chip C1 and the long side of the second chip C2, respectively, and thus a plurality of chips may be efficiently disposed on one double-side flexible circuit board 100 for all-in-one chip on film.

The length in the horizontal direction (long side) of the first chip C1 may be larger than the length in the horizontal direction (long side) of the second chip C2. The length in the vertical direction (short side) of the first chip C1 may be smaller than the length in the vertical direction (short side) of the second chip C2. Referring to FIG. 13A, the second chip C2 may be disposed at a lower portion of the first chip C1. At least a part or all of the long side of the first chip C1 and the long side of the second chip C2 may be overlapped vertically.

Referring to 13B, the second chip C2 may be disposed on a side portion of the first chip C1. The long side of the first chip C1 and the long side of the second chip C2 may not be overlapped vertically.

The first chip C1 is a drive IC chip, and the second chip C2 may include a second chip C2A of any one of a diode chip, a power supply IC chip, a touch sensor IC chip, an MLCC chip, a BGA chip, and a chip condenser and one second chip C2B different from the any one of the diode chip, the power supply IC chip, the touch sensor IC chip, the MLCC chip, the BGA chip, the chip condenser.

With reference to FIGS. 13 to 16, a manufacturing step of a chip package including a double-side flexible circuit board for all-in-one chip on film according to the embodiment will be described.

FIG. 13 is a plan view of a double-side flexible circuit board 100 for all-in-one chip on film according to the embodiment.

Referring to FIGS. 13A and 13B, the protection layer 140, which is positioned on one surface of the double-side flexible circuit board 100 for all-in-one chip on film according to an embodiment, may include a plurality of holes. That is, the protection layer 140 may include a plurality of open regions.

The first open region OA1 of the protection layer may be a region exposed to be connected to the first connection part 70. The conductive pattern part CP exposed in the first open region OA1 of the protection layer may include pure plating on a surface facing the first connection part. That is, in the first open region OA1 of the protection layer, a content of tin of the second plating layer included in the conductive pattern part CP may be 50 atomic % or more.

The second open region OA2 of the protection layer may be a region exposed to be connected to the second connection part 80. The conductive pattern part CP exposed in the second open region OA2 of the protection layer may include an alloy layer of copper and tin on a surface facing the second connection part. That is, in the second open region OA2 of the protection layer, the content of tin of the second plating layer included in the conductive pattern part CP may be less than 50 atomic %.

The first open region OA1 may be a region for connecting a first chip. The first inner lead pattern part I1 extending from the first outer lead pattern part O1 positioned in the third open region OA3 and facing the inside of the first open region OA1 may correspond to or have a different width from the first outer lead pattern part O1. For example, a width W1 of the first outer lead pattern part O1 may correspond to a width W2 of the first inner lead pattern part I1. For example, the width W1 of the first outer lead pattern part O1 may be larger than the width W2 of the first inner lead pattern part I1. Specifically, a difference between the width W1 of the first outer lead pattern part O1 and the width W2 of the first inner lead pattern part I1 may be within 20%.

The first inner lead pattern part I1 and the third inner lead pattern part I3 extending toward the inside of the first open region OA1 may have a width corresponding to each other.

The first outer lead pattern part O1 and the second outer lead pattern part O2 extending from the first open region OA1 toward an outer periphery of the substrate may have a width corresponding to each other. Accordingly, a first chip having a fine line width and requiring a large number of first connection parts, and a second chip having a large line width and requiring a small number of second connection parts may all be mounted on one flexible circuit board for all-in-one chip on film 100. At this time, the fine line width may mean that a line width of any one of the first outer lead pattern part O1 and the second outer lead pattern part O2 is smaller than that of any one of a fifth outer lead pattern part O5 and a sixth outer lead pattern part O6. On the other hand, the large line width may mean that a line width of any one of the first outer lead pattern part O1 and the second outer lead pattern part O2 is relatively larger than that of any one of the fifth outer lead pattern part O5 and the sixth outer lead pattern part O6.

The flexible circuit board 100 for all-in-one chip on film may include a plurality of the second open regions OA2 for connecting second chips C2a and C2b which are different types, respectively.

One of the second open regions OA2 may be a region for connecting one second chip C2a. The fifth outer lead pattern part O5 extending from a fifth inner lead pattern part I5 positioned in the second open region OA2 toward the outer periphery of the substrate may have a different width. For example, a width W3 of the fifth inner lead pattern part I5 may be larger than a width W4 of the fifth outer lead pattern part O5. Specifically, the width W3 of the fifth inner lead pattern part I5 may be larger 1.5 times or more than the width W4 of the fifth outer lead pattern part O5.

Another one of the second open region OA2 may be a region for connecting another one second chip C2b. The sixth outer lead pattern part O6 extending from a sixth inner lead pattern part I6 positioned in the second open region OA2 toward the outer periphery of the substrate may have a different width. For example, a width W5 of the sixth inner lead pattern part I6 may be larger than a width W6 of the sixth outer lead pattern part O6. Specifically, the width W5 of the sixth inner lead pattern part I6 may be larger 1.5 times or more than the width W6 of the sixth outer lead pattern part O6.

Any one of the width W3 of the fifth inner lead pattern part I5 and the width W5 of the sixth inner lead pattern part I6 exposed through the second open region may be greater than the width W2 of the first inner lead pattern part I1 exposed through the first open region. Accordingly, lead pattern parts corresponding to the first and second connection parts having various sizes/shapes may be formed, thereby improving the degree of freedom in design. That is, the embodiment may include various sizes of inner lead pattern parts and various shapes of inner lead pattern parts suitable for different types of the first chip and the second chip, thereby enabling an optimal chip package.

A shape of an in-lead pattern positioned below the first chip may be different from that of an in-lead pattern positioned below the second chip. Accordingly, the embodiment may include in-lead pattern parts having different shapes, which may have excellent adhesion characteristics with the first chip and second chip of different types. Therefore, the flexible circuit board for all-in-one chip on film according to the embodiment may have excellent bonding characteristics between the first chip and the second chip.

That is, different types of the first chip and the second chip are mounted on one substrate, and thus the in-lead pattern part having different shapes may be an optimal pattern design for ensuring a predetermined bonding strength.

A shape of the first inner lead pattern part I1 in a plane may be a square stripe pattern. Specifically, the shape of the first inner lead pattern part I1 in the plane may be a square stripe pattern having a uniform width and extending in one direction. As an example, widths of one end and the other end of the first inner lead pattern part I1 may be the same.

For example, a shape of the fifth inner lead pattern part I5 or the sixth inner lead pattern part I6 in the plane may be a protrusion pattern having various shapes such as a polygonal shape, a circular shape, an elliptical shape, a hammer shape, a T shape, a random shape, and the like. Specifically, the shape of the fifth inner lead pattern part I5 or the sixth inner lead pattern part I6 in the plane has a variable width, and may be a protruding pattern such as a polygonal shape, a circular shape, an elliptical shape, a hammer shape, a T shape, a random shape, and the like extending in a direction different from the one direction. As an example, widths of one end and the other end of at least one of the fifth inner lead pattern part I5 and the sixth inner lead pattern part I6 may be different from each other. The width of the other end which is an end portion far from the protection layer may be larger than that of the one end of the fifth inner lead pattern part I5 and the sixth inner lead pattern part I6 near the protection layer. However, the embodiment is not limited thereto, and of course, the width of the other end which is the end portion far from the protection layer may be smaller than that of the one end of the fifth inner lead pattern part I5 and the sixth inner lead pattern part I6 near the protection layer.

As an example, when the second chip is an MLCC chip, the inner lead pattern part may have a T shape like the fifth inner lead pattern part I5 of FIG. 13B.

As an example, when the second chip is a BGA chip, the inner lead pattern part may be a circular shape like the sixth inner lead pattern part I6 of FIG. 13A. Alternatively, when the second chip is a BGA chip, the inner lead pattern part may be a semicircular shape or a shape in which an end is rounded like the sixth inner lead pattern part I6 of FIG. 13B.

Shapes of the first inner lead pattern part and the first connection part may be the same. For example, shapes of planes (top view) of the first inner lead pattern part and the first connection part may be a quadrangular shape. Here, the fact that the first inner lead pattern part and the first connection part have the same shape means that the top view is the same polygon, and may include that sizes are different.

Shapes of the fifth inner lead pattern part and the second connection part may be the same or different from each other. Shapes of the sixth inner lead pattern part and the second connection part may be the same or different from each other.

Referring to FIG. 13B and FIG. 14B, the top view of the fifth inner lead pattern part I5 may be a polygonal shape, and the top view of the second connection part may be a circular shape. The top view of the sixth inner lead pattern part I6 may be a circular shape, and the second connection part may be a circular shape.

Referring to FIG. 13B and FIG. 14B, the top view of the fifth inner lead pattern part I5 may be a polygonal shape, and the second connection part may be a quadrangular shape having rounded corners or an elliptical shape. The top view of the sixth inner lead pattern part I6 may be a semicircular shape, and the second connection part may be a circular shape.

In the top view of the first connection part 70, a horizontal length and a vertical length (aspect ratio) may correspond to each other, or may be different from each other. For example, the top view of the first connection part 70 may be a square shape in which the horizontal length and the vertical length (aspect ratio) correspond to each other, or may be rectangular shape in which the horizontal length and the vertical length (aspect ratio) are different from each other.

In the top view of the second connection part 80, the horizontal length and the vertical length (aspect ratio) may correspond to each other, or may be different from each other. For example, the top view of the second connection part 80 may be a circular shape in which the horizontal length and the vertical length (aspect ratio) correspond to each other, or may be an elliptical shape in which the horizontal length and the vertical length (aspect ratio) are different from each other.

A first pitch which is a distance between adjacent the first outer lead pattern parts O1 may be smaller than a second pitch which is a distance between adjacent at least one outer lead pattern parts of the fifth outer lead pattern part O5 and the sixth outer lead pattern part O6. At this time, the first pitch and the second pitch may refer to an average separation distance between two adjacent conductive pattern parts.

The first pitch P1 may be less than 100 μm. For example, the first pitch may be less than 30 μm. For example, the first pitch may be 1 μm to 25 μm.

The second pitch P2 may be 100 μm or more. For example, the second pitch may be 100 μm to 500 μm. For example, the second pitch may be 100 μm to 300 μm.

Accordingly, signal interference between the conductive pattern parts connected to the first chip and the second chip, respectively may be prevented, and it is possible to improve accuracy of signals.

In the first open region OA1, a plane area of the first inner lead pattern part I1 may correspond to or different from the first connection part 70.

The width of the first inner lead pattern part I1 and the width of the first connection part 70 may be the same or different within 20%. Accordingly, the first inner lead pattern part I1 and the first connection part 70 may be stably mounted. In addition, adhesion characteristics between the first inner lead pattern part I1 and the first connection part 70 may be improved.

In the second open region OA2, a plane area of any one inner lead pattern part of the fifth inner lead pattern part I5 and the sixth inner lead pattern part I6 may correspond to or different from the second connection part 80.

As an example, a width of the second connection part 80 may be larger 1.5 times or more than that of any one inner lead pattern part of the fifth inner lead pattern part I5 and the sixth inner lead pattern part I6. Accordingly, adhesion characteristics between any one of the fifth inner lead pattern part I5 and the sixth inner lead pattern part I6 and the second connection part 80 may be improved.

Referring to FIGS. 14A and 14B, a step of disposing a first connection part 70 and a second connection part 80 on a flexible circuit board 100 for all-in-one chip on film of an embodiment will be described.

The first connection part 70 may be disposed on the first inner lead pattern part I1 and the third inner lead pattern part I3 exposed through the first open region OA1, respectively. For example, the first connection part 70 may cover entirely or partially upper surfaces of the first inner lead pattern part I1 and the third inner lead pattern part I3.

A total number of a plurality of the first inner lead pattern parts I1 disposed to be spaced apart from each other and a plurality of the third inner lead pattern parts I3 disposed to be spaced from each other may correspond to a number of the first connection part 70.

For example, referring to FIGS. 15A and 15B, the number of the plurality of the first inner lead pattern parts I1 that are spaced apart from each other is nine, and the number of the plurality of the third inner lead pattern parts I3 that are spaced apart from each other is nine, and the number of the first connection part 70 may be 18 which is the sum of nine, the number of the first inner lead pattern part I1 and nine, the number of the plurality of third inner lead pattern parts I3 that are spaced apart from each other.

The second connection part 80 may be disposed on the fifth inner lead pattern part I5 and the sixth inner lead pattern part I6 exposed through the second open region OA2, respectively. For example, the second connection part 80 may cover entirely or partially upper surfaces of the fifth inner lead pattern part I5 and the sixth inner lead pattern part I6.

A number of a plurality of the fifth inner lead pattern parts I5 disposed to be spaced apart from each other may correspond to a number of the second connection part 80 disposed on the fifth inner lead pattern part I5.

For example, referring to FIGS. 15A and 15B, the number of a plurality of the fifth inner lead pattern parts I5 disposed to be spaced apart from each other may be two, and the number of the second connection part 80 disposed on the fifth inner lead pattern parts I5 may be two.

A number of a plurality of the sixth inner lead pattern part I6 disposed to be spaced apart from each other may correspond to a number of the second connection part 80 disposed on the sixth inner lead pattern part I6.

For example, referring to FIGS. 15A and 15B, the number of the plurality of the sixth inner lead pattern part I6 disposed to be spaced apart from each other may be three, and the number of the second connection part 80 disposed on the sixth inner lead pattern part I6 may be three.

The second connection part 80 may be larger than the first connection part 70. A width of the fifth inner lead pattern parts I5 or the sixth inner lead pattern part I6 exposed through the second open region is larger than that of a first inner lead pattern part I1 exposed through the first open region, and thus the second connection part 80 may be larger than the first connection part 70.

A step of disposing the first chip C1 and second chips C2a and C2b on the flexible circuit board 100 for all-in-one chip on film will be described with reference to FIGS. 15A and 15B.

The first chip C1 may be disposed on the first connection part 70.

The second chip C2 may be disposed on the second connection part 80.

The first chip C1 and the second chip C2 may be disposed to be spaced apart at a predetermined distance in order to prevent problems such as signal interference, disconnection failures, failures due to heat, or the like.

FIG. 16 is a cross-sectional view of a chip package including a double-side flexible circuit board for all-in-one chip on film according to FIGS. 15A and 15B.

The first chip C1 and the second chip C2 may be disposed in different sizes on the same one surface. For example, the second chip C2 may be larger than the first chip C1.

A via hole may be disposed at a lower portion of the first chip C1 and the second chip C2. That is, a substrate 110 in a region corresponding to the first open region OA1 and the second open region OA2 may include the via hole.

An electrical signal of the second chip C2 may be transmitted from the upper surface to the lower surface of the substrate through a conductive material disposed in a fourth via hole V4. Accordingly, the embodiment may include a large number of conductive pattern parts on one substrate.

The flexible circuit board 100 for all-in-one chip on film according to the embodiment may realize a conductive pattern part with a fine pitch on both surfaces thereof, and thus it may be suitable for an electronic device having a high-resolution display portion.

In addition, the flexible circuit board 100 for all-in-one chip on film according to the embodiment is flexible, small in size, and thin in thickness, and thus it may be used for various electronic devices.

For example, referring to FIG. 17, the flexible circuit board 100 for an all-in-one chip on film according to the embodiment may be reduced a bezel, and thus it may be used for an edge display.

For example, referring to FIG. 18, the flexible circuit board 100 for all-in-one chip on film according to the embodiment may be included in a fordable flexible electronic device. Therefore, the touch device including the same may be a flexible touch device. And thus, a user may fold or bend by hand. Such a flexible touch window may be applied to a wearable touch device or the like.

For example, referring to FIG. 19, a flexible circuit board 100 for all-in-one chip on film according to an embodiment may be applied to various electronic devices to which a foldable display device is applied. Referring also to FIGS. 19A to 19C, the foldable display device may fold a foldable cover window. The foldable display device may be included in various portable electronic products. Specifically, the foldable display device may be included in a mobile terminal (mobile phone), a notebook (portable computer), and the like. Accordingly, while increasing the display region of a portable electronic product, a size of the device may be reduced during storage and transportation, and thus portability may be improved. Therefore, convenience of a user of the portable electronic product may be improved. However, the embodiment is not limited thereto, and of course, the foldable display device may be used for various electronic products.

Referring to FIG. 19A, a foldable display device may include one folding region in a screen region. For example, the foldable display device may have a C-shape in a folded form. That is, in the foldable display device, one end and the other end opposite to the one end may be overlapped with each other. At this time, the one end and the other end may be disposed close to each other. For example, the one end and the other end may be disposed to face each other.

Referring to 19B, a foldable display device may include two folding regions in a screen region. For example, the foldable display device may have a G-shape in a folded form. That is, the foldable display device may be overlapped with each other by folding one end and the other end opposite to the one end in a direction corresponding to each other. At this time, the one end and the other end may be spaced apart from each other. For example, the one end and the other end may be disposed in parallel to each other.

Referring to FIG. 19C, a foldable display device may include two folding regions in a screen region. For example, the foldable display device may have an S-shape in a folded form. That is, in the foldable display device, one end and the other end opposite to the one end may be folded in different directions. At this time, the one end and the other end may be spaced apart from each other. For example, the one end and the other end may be disposed in parallel to each other.

In addition, although not shown in the drawings, of course, a flexible circuit board 100 for all-in-one chip on film according to an embodiment may be applied to a rollable display.

Referring to FIG. 20, a flexible circuit board 100 for all-in-one chip on film according to an embodiment may be included in various wearable touch devices including a curved display. Therefore, an electronic device including the flexible circuit board 100 for all-in-one chip on film according to the embodiment may be reduced in thickness, size and weight.

Referring to FIG. 21, a flexible circuit board 100 for all-in-one chip on film according to an embodiment may be used for various electronic devices having a display portion such as a TV, a monitor, and a laptop computer.

However, the embodiment is not limited thereto, and of course, the flexible circuit board for all-in-one chip on film 100 according to the embodiment may be used for various electronic devices having a flat plate or a curved-shaped display portion.

According to an embodiment of the present invention, different types of first and second chips may be mounted on one flexible circuit board, and thus the embodiment may provide a chip package including a flexible circuit board for all-in-one chip on film with improved reliability.

According to an embodiment of the present invention, a display panel and a main board are directly connected by one flexible circuit board for all-in-one chip on film, and thus a size and thickness of the flexible circuit board for transmitting a signal generated from the display panel to the main board may be reduced, and accordingly, it is possible to increase spaces of other components and/or a battery space.

According to an embodiment of the present invention, since connection of a plurality of printed circuit boards is not required, convenience of a process and reliability of electrical connection may be improved, and accordingly, it is possible to provide a flexible circuit board for all-in-one chip on film suitable for an electronic device having a high-resolution display unit.

In addition, according to an embodiment of the present invention, a dummy pattern is disposed at a second surface of a substrate to correspond to a circuit pattern disposed on a first surface of the substrate, and a dummy pattern is disposed at the first surface of the substrate so as to correspond to a circuit pattern disposed on the second surface of the substrate, and thus it is possible to solve a problem of solder resist not being applied or a problem of pinholes that occurs when printing the solder resist of the first surface or the second surface of the substrate.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

In addition, embodiments are mostly described above. However, they are only examples and do not limit the present invention. A person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

What is claimed is:

1. A flexible circuit board comprising:
   a substrate;
   a first conductive pattern part disposed on a first surface of the substrate;
   a second conductive pattern part disposed on a second surface opposite to the first surface of the substrate;
   a first dummy pattern part disposed in a region of the second surface of the substrate in which the second conductive pattern part is not disposed;
   a first protection layer disposed on the first conductive pattern part; and
   a second protection layer disposed on the second conductive pattern part and the first dummy pattern part,
   wherein the first conductive pattern part at an outermost periphery of the substrate is covered by the first protection layer, and
   wherein the first dummy pattern part includes:
   a first wiring pattern layer, and
   a first plating layer including tin (Sn) disposed on the first wiring pattern layer.

2. The flexible circuit board of claim 1, wherein the first dummy pattern part is vertically overlapped with the first conductive pattern part disposed at the outermost periphery of the substrate and the first protection layer.

3. The flexible circuit board of claim 1, further comprising a second dummy pattern part which is disposed in a region of the first surface of the substrate in which the first conductive pattern part is not disposed and at least a part of which is vertically overlapped with the second conductive pattern part.

4. The flexible circuit board of claim 3, wherein the first surface is an upper surface of the substrate,
   the second surface is a lower surface of the substrate, and
   a left side of the first dummy pattern part is positioned closer to a left end of the substrate than a left side of the first conductive pattern part disposed on the leftmost side of the first conductive pattern part.

5. The flexible circuit board of claim 3, wherein a right side of the second dummy pattern part is positioned closer to a right end of the substrate than a right side of the second conductive pattern part disposed on the rightmost side of the second conductive pattern part.

6. The flexible circuit board of claim 3, wherein the second dummy pattern part includes
   a second wiring pattern layer, and
   a second plating layer including tin (Sn) disposed on the second wiring pattern layer.

7. The flexible circuit board of claim 6, wherein the first and second dummy pattern parts have the same layer structure as the first and second conductive pattern parts.

8. The flexible circuit board of claim 7, wherein the first plating layer of the first dummy pattern part includes:
   a first-first plating layer disposed on the first wiring pattern layer, and
   a first-second plating layer disposed on the first-first plating layer,
   wherein the second plating layer of the second dummy pattern part includes:
   a second-first plating layer disposed on the second wiring pattern layer, and
   a second-second plating layer disposed on the second-first plating layer.

9. The flexible circuit board of claim 3, wherein a position in which the second conductive pattern part is started initially at the second surface of the substrate is the same as a position in which the second dummy pattern part is started initially at the first surface of the substrate.

10. The flexible circuit board of claim 1, wherein a position in which the first conductive pattern part is started initially at the first surface of the substrate is farther than a position in which the first dummy pattern part is started initially at the second surface of the substrate.

11. A chip package which comprises a flexible circuit board, the flexible circuit board comprising:
    a substrate;
    a first conductive pattern part disposed on a first surface of the substrate;
    a second conductive pattern part disposed on a second surface opposite to the first surface of the substrate;
    a first dummy pattern part disposed in a region of the second surface of the substrate in which the second conductive pattern part is not disposed;
    a first protection layer disposed on the first conductive pattern part;
    a second protection layer disposed on the second conductive pattern part and the first dummy pattern part,
    a chip disposed on the first conductive pattern part or the second conductive pattern part,
    wherein the first conductive pattern part at an outermost periphery of the substrate is covered by the first protection layer, and
    wherein the first dummy pattern part includes:
    a first wiring pattern layer, and a first plating layer including tin (Sn) disposed on the first wiring pattern layer.

12. The chip package of claim 11, wherein the flexible circuit board further comprises:

a second dummy pattern part which is disposed in a region of the first surface of the substrate in which the first conductive pattern part is not disposed and at least a part of which is vertically overlapped with the second conductive pattern part, wherein the second dummy pattern part includes a second wiring pattern layer, and a second plating layer including tin (Sn) disposed on the second wiring pattern layer, wherein the first conductive pattern part has the same layer structure as the second dummy pattern part, and wherein the second conductive pattern part has the same layer structure as the first dummy pattern part.

13. The chip package of claim 12, wherein the first surface is an upper surface of the substrate, the second surface is a lower surface of the substrate, wherein the first dummy pattern part is disposed more to the left than the second conductive pattern part disposed on the leftmost side of the second conductive pattern part, and wherein the second dummy pattern part is disposed more to the right than the first conductive pattern part disposed on the rightmost side of the first conductive pattern part.

14. The chip package of claim 13, wherein the first dummy pattern part is disposed more to the left than the first conductive pattern part disposed on the leftmost side of the first conductive pattern part, and the second dummy pattern part is disposed more to the right than the second conductive pattern part disposed on the rightmost side of the second conductive pattern part.

15. The chip package of claim 12, wherein an end portion of the first dummy pattern part disposed on the leftmost side of the first dummy pattern part is aligned on a vertical line with an end portion of the first conductive pattern part disposed on the leftmost side of the first conductive pattern part, and an end portion of the second dummy pattern part disposed on the rightmost side of the second dummy pattern part is aligned on a vertical line with an end portion of the second conductive pattern part disposed on the rightmost side of the second conductive pattern part.

16. The chip package of claim 12, wherein a position in which the first conductive pattern part is started initially at the first surface of the substrate is the same as a position in which the first dummy pattern part is started initially at the second surface of the substrate.

17. The chip package of claim 12, wherein a position in which the first conductive pattern part is started initially at the first surface of the substrate is farther than a position in which the first dummy pattern part is started initially at the second surface of the substrate.

18. The chip package of claim 12, wherein a position in which the second conductive pattern part is started initially at the second surface of the substrate is the same as a position in which the second dummy pattern part is started initially at the first surface of the substrate.

19. The chip package of claim 12, wherein a position in which the second conductive pattern part is started initially at the second surface of the substrate is farther than a position in which the second dummy pattern part is started initially at the first surface of the substrate.

* * * * *